United States Patent
Shin et al.

(10) Patent No.: US 12,057,191 B1
(45) Date of Patent: Aug. 6, 2024

(54) MEMORY PACKAGE, STORAGE DEVICE INCLUDING MEMORY PACKAGE, AND STORAGE DEVICE OPERATING METHOD

(71) Applicant: SAMSUNG ELECTRONICS CO., LTD., Suwon-si (KR)

(72) Inventors: Ji-Yeon Shin, Anyang-si (KR); Daehoon Na, Seoul (KR); Jonghwa Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/133,247

(22) Filed: Apr. 11, 2023

Related U.S. Application Data

(63) Continuation of application No. 17/243,870, filed on Apr. 29, 2021, now Pat. No. 11,651,805.

(30) Foreign Application Priority Data

Nov. 2, 2020 (KR) ........................ 10-2020-0144173

(51) Int. Cl.
| | |
|---|---|
| *G11C 7/10* | (2006.01) |
| *G11C 7/22* | (2006.01) |
| *H01L 25/065* | (2023.01) |
| *H01L 25/10* | (2006.01) |
| *H01L 25/18* | (2023.01) |

(52) U.S. Cl.
CPC ............ *G11C 7/22* (2013.01); *H01L 25/0652* (2013.01); *H01L 25/105* (2013.01); *H01L 25/18* (2013.01); *H01L 2225/06506* (2013.01); *H01L 2225/06562* (2013.01); *H01L 2225/06586* (2013.01)

(58) Field of Classification Search
CPC ..... G11C 7/22; H01L 25/0652; H01L 25/105; H01L 25/18; H01L 2225/06506; H01L 2225/06562; H01L 2225/06586
USPC ....................................................... 365/189.02
See application file for complete search history.

(56) References Cited

U.S. PATENT DOCUMENTS

| | | | |
|---|---|---|---|
| 6,417,718 B1 | 7/2002 | Ota | |
| 6,526,466 B1 | 2/2003 | Frake et al. | |
| 7,005,748 B2 | 2/2006 | Kim et al. | |
| 7,181,584 B2 | 2/2007 | LaBerge | |
| 7,245,141 B2 | 7/2007 | Ong | |
| 7,253,457 B2 | 8/2007 | Hirose | |
| 7,539,826 B2 | 5/2009 | Chae et al. | |
| 7,741,723 B2 | 6/2010 | Uchida | |
| 7,999,367 B2 * | 8/2011 | Kang | G11C 5/025 257/E23.012 |

(Continued)

FOREIGN PATENT DOCUMENTS

JP 2013210910 A 10/2013

*Primary Examiner* — Viet Q Nguyen
(74) *Attorney, Agent, or Firm* — Fish & Richardson P.C.

(57) ABSTRACT

A memory package includes; a first memory chip including first memory pads, and a buffer chip including first buffer pads respectively connected with the first memory pads and second buffer pads connected with an external device. The buffer chip respectively communicates signals received via the second buffer pads to the first buffer pads in response to a swap enable signal having a disabled state, and the buffer chip swaps signals received via the second buffer pads to generate first swapped signals, and respectively communicates the first swapped signals to the first buffer pads in response to the swap enable signal having an enabled state.

16 Claims, 17 Drawing Sheets

(56) References Cited

U.S. PATENT DOCUMENTS

| | | |
|---|---|---|
| 8,199,521 B2 | 6/2012 | Muff |
| 8,331,161 B2 | 12/2012 | Noh |
| 8,644,084 B2 | 2/2014 | Park |
| 9,886,379 B2 | 2/2018 | Kim |
| 10,108,684 B2 | 10/2018 | Abraham et al. |
| 10,418,345 B2 | 9/2019 | Suzuki et al. |
| 10,929,024 B2* | 2/2021 | Park ..................... G06F 3/0688 |
| 11,054,992 B2 | 7/2021 | Lee |
| 11,322,480 B2 | 5/2022 | Suzuki et al. |
| 11,651,805 B2* | 5/2023 | Shin ........................ G11C 7/22 |
| | | 365/189.02 |
| 11,837,273 B2* | 12/2023 | Lee ..................... G11C 29/028 |
| 11,881,279 B2* | 1/2024 | Park ..................... G11C 5/063 |
| 2005/0224948 A1* | 10/2005 | Lee ........................ H05K 1/181 |
| | | 257/686 |
| 2012/0221882 A1 | 8/2012 | Morrison et al. |
| 2014/0217586 A1* | 8/2014 | Kim ..................... H01L 25/105 |
| | | 257/738 |
| 2015/0378885 A1* | 12/2015 | Kim ................... G06F 12/0246 |
| | | 711/103 |
| 2016/0012865 A1 | 1/2016 | Lee et al. |
| 2021/0242171 A1* | 8/2021 | Lee ........................ H01L 25/18 |
| 2022/0076712 A1* | 3/2022 | Park ....................... H10B 43/35 |
| 2022/0101893 A1 | 3/2022 | Park et al. |
| 2022/0157353 A1* | 5/2022 | Kim ........................ G11C 8/12 |

\* cited by examiner

MEMORY PACKAGE, STORAGE DEVICE INCLUDING MEMORY PACKAGE, AND STORAGE DEVICE OPERATING METHOD

CROSS-REFERENCE TO RELATED APPLICATIONS

This is a Continuation of U.S. application Ser. No. 17/243,870, filed Apr. 29, 2021, and a claim priority under 35 U.S.C. § 119 is made to Korean Patent Application No. 10-2020-0144173 filed on Nov. 2, 2020, in the Korean Intellectual Property Office, the subject matter of which is hereby incorporated by reference.

BACKGROUND

The inventive concept relates to semiconductor memories, and more particularly, to memory packages providing improved signal integrity and improved power integrity at reduced overall cost, as well as storage devices including such memory packages and storage device operating methods.

A nonvolatile storage device is used to store data in a computing system such that the data are retained even when a power is interrupted. A storage device may include a nonvolatile memory such as a flash memory, a phase change memory, a magnetic memory, a ferroelectric memory, or a resistive memory and may be called auxiliary storage in a hierarchical structure of the computing system.

The operating speed of conventional storage devices has been considered a performance bottleneck. However, as storage devices have adopted nonvolatile memory-based solid state drives, instead of conventional hard disk drives, the communication speed between a host device and the storage device—instead of the operating speed of the storage device—has become the performance bottleneck.

Accordingly, the development of protocols defining a communication method between the host device and storage device have become an important area of consideration. In particular, as clock speeds associated with a communication protocol increase, signal integrity and a power integrity may become impaired.

SUMMARY

Embodiments of the inventive concept provide a memory package providing improved signal integrity and improved power integrity with reduced costs by supporting package mirroring without changing a legacy structure of a nonvolatile memory chip, a storage device including the memory package, and an operating method of the storage device.

According to an embodiment, a memory package includes; a first memory chip including first memory pads, and a buffer chip including first buffer pads respectively connected with the first memory pads and second buffer pads connected with an external device, wherein the buffer chip respectively communicates signals received via the second buffer pads to the first buffer pads in response to a swap enable signal having a disabled state, and the buffer chip swaps signals received via the second buffer pads to generate first swapped signals, and respectively communicates the first swapped signals to the first buffer pads in response to the swap enable signal having an enabled state.

According to an embodiment, a storage device includes; a printed circuit board, a first memory package disposed on an upper surface of the printed circuit board and including a first package substrate, first memory chips stacked on the first package substrate, and a first buffer chip disposed on the first package substrate and electrically connecting the first memory chips with first solder balls associated with the first memory package, wherein the first buffer chip enables a swap of signals at the first solder balls in response to a swap enable signal, and a second memory package disposed on a lower surface of the printed circuit board and including a second package substrate, second memory chips stacked on the second package substrate, and a second buffer chip disposed on the second package substrate and electrically connecting the second memory chips with second solder balls associated with the second memory package, wherein the second buffer chip disables a swap of signals at the second solder balls in response to the swap enable signal.

According to an embodiment, an operating method for a storage device including memory chips and a buffer chip includes; receiving first signals from an external device at the buffer chip, swapping the first signals at the buffer chip in response to a swap enable signal to generate swapped first signals, communicating the swapped first signals to at least one of the memory chips, and communicating the first signals to at least another one of the memory chips, receiving second signals from memory chips at the buffer chip, swapping the second signals at the buffer chip in response to the swap enable signal to generate swapped first signals, and communicating the swapped second signals and the second signals to the external device.

BRIEF DESCRIPTION OF THE DRAWINGS

The above and other objects and features of the inventive concept will become more apparent to those skilled in the art upon consideration of the following detail description together with the accompanying drawings, in which.

DETAILED DESCRIPTION

Certain embodiments of the inventive concept will now be described in some additional detail with reference to the accompanying drawings. Throughout the written description and drawings, like reference numbers and labels are used to denote like or similar elements, components and/or features.

Throughout the written description certain geometric or spatial terms may be used to highlight relative relationships between elements, components and/or features with respect to embodiments of the inventive concept. Those skilled in the art will recognize that such terms are relative in nature, arbitrary in descriptive context and/or directed to certain aspect(s) of the illustrated embodiments. Such geometric terms may include, for example: height/width; vertical/horizontal; upper/lower; higher/lower; closer/farther; thicker/thinner; proximate/distant; above/below; under/over; upper/lower; center/side; surrounding; overlay/underlay; etc.

Figure 1:
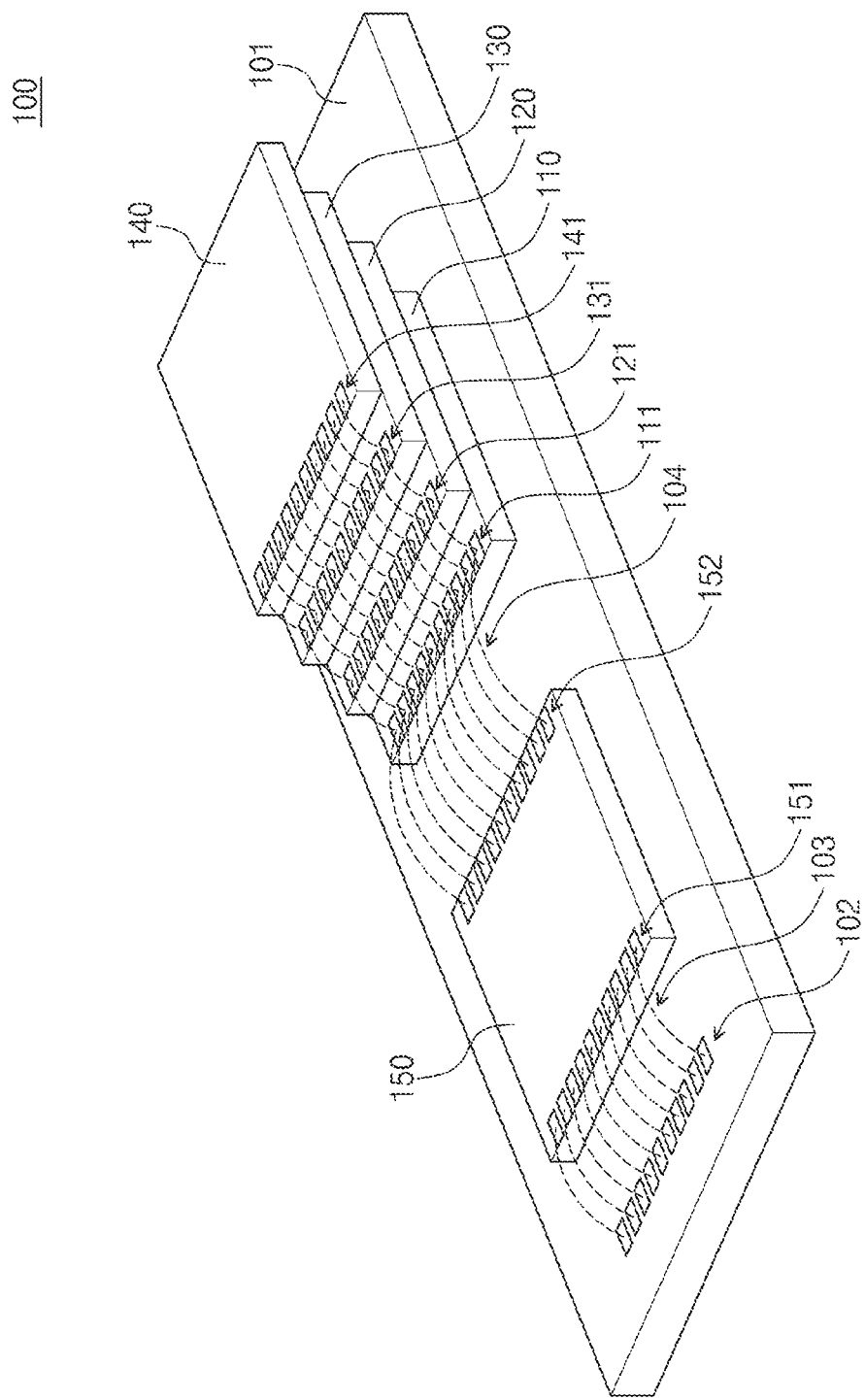
FIG. 1 is a perspective diagram and FIG. 2 is a cross-sectional diagram illustrating a memory package 100 according to embodiments of the inventive concept.
Figure 2:
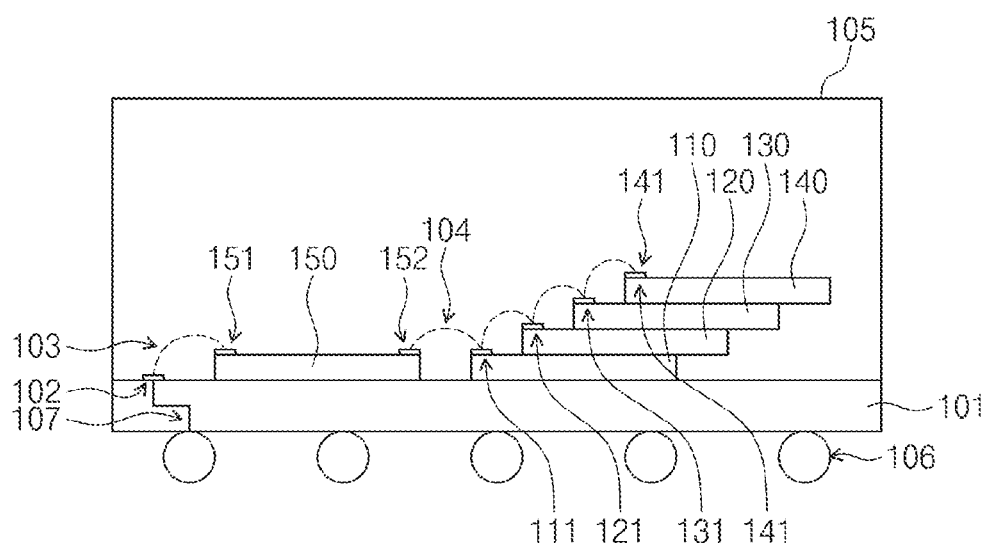

Figure (FIG. 1 is a perspective diagram and FIG. 2 is a cross-sectional diagram collectively illustrating a memory package 100 according to embodiments of the inventive concept.

Referring to FIGS. 1 and 2, the memory package 100 may include a package substrate 101, package pads 102, first package wires 103, second package wires 104, a mold 105, solder balls 106, a first nonvolatile memory chip 110, a second nonvolatile memory chip 120, a third nonvolatile memory chip 130, a fourth nonvolatile memory chip 140 (hereafter, collectively referred to as "first to fourth nonvolatile memory chips 110 to 140") and a buffer chip 150.

In some embodiments, the package substrate 101 may be a printed circuit board (PCB). The package substrate 101 may electrically connect the package pads 102 with the solder balls 106. For example, the package substrate 101 may include "wires" 107 (e.g., through-wires and/or through contacts) that route (and/or reroute) electrical connections among the various package pads 102 and the solder balls 106.

The package pads 102 may be disposed on an upper surface of the package substrate 101. Here, the first package wires 103 may respectively connect the package pads 102 with the buffer chip 150. That is, the first package wires 103 may be respectively connected between at least one of the package pads 102 and at least one of first buffer pads 151 disposed (e.g.,) on an upper surface of the buffer chip 150.

The second package wires 104 may respectively connect second buffer pads 152 of the buffer chip 150 with at least one of the first to fourth nonvolatile memory chips 110 to 140. In some embodiments, for example, first memory pads 111 of the first nonvolatile memory chip 110, second memory pads 121 of the second nonvolatile memory chip 120, third memory pads 131 of the third nonvolatile memory chip 130 and/or fourth memory pads 141 of the fourth nonvolatile memory chip 140 may be variously (e.g., respectively and sequentially) connected by the second package wires 104. That is, in the illustrated example of FIG. 1, the second package wires 104 respectively and sequentially connect the second buffer pads 152 with the first memory pads 111, the second memory pads 121, the third memory pads 131, and the fourth memory pads 141. Accordingly, each of the second package wires 104 may be commonly connected with a corresponding pad of the first memory pads 111, a corresponding pad of the second memory pads 121, a corresponding pad of the third memory pads 131 and a corresponding pad of the fourth memory pads 141.

Those skilled in the art will recognize that a number of first buffer pads 151 and/or a number of first package wires 103 may be different from a number of second buffer pads 152 and/or a number of second package wires 104. For example, the number of first buffer pads 151 and/or the number of first package wires 103 may exceed the number of second buffer pads 152 and/or the number of second package wires 104. That is, one or more signals communicated from an external device to the buffer chip 150 via the solder balls 106 and the wires 107 associated with the package substrate (e.g., a PCB) 101 may terminate at the buffer chip 150 and not be communicated to the first to fourth nonvolatile memory chips 110 to 140.

The mold 105 may be provided to cover the first to fourth nonvolatile memory chips 110 to 140 and the buffer chip 150 on the package substrate 101. In this regard, the mold 105 may encapsulate (wholly or in part) the first to fourth nonvolatile memory chips 110 to 140 and the buffer chip 150, thereby protecting these components from contamination and environmental factors, such as moisture, humidity, temperature and static electricity. One or more external devices(s) (hereafter, singularly or collectively the "external device") may be variously connected to the buffer chip 150 and the first to fourth nonvolatile memory chips 110 to 140 via the solder balls 106. That is, the solder balls 106 may be used to selectively communicate various signals between the external device and the buffer chip 150.

Each of the first to fourth nonvolatile memory chips 110 to 140 may include at least one nonvolatile memory device, such as a flash memory, a phase change memory, a ferroelectric memory, a magnetic memory, a resistive memory, etc. In some embodiments, the first to fourth nonvolatile memory chips 110 to 140 may each include one or more flash memory device(s), however the scope of the inventive concept is not limited thereto.

The first memory pads 111 of the first nonvolatile memory chip 110 may be variously and electrically connected with internal components of the first nonvolatile memory chip 110. That is, the first nonvolatile memory chip 110 may communicate with an external device (via the buffer chip 150) through the first memory pads 111. The respective configuration and operation of the second, third and fourth nonvolatile memory chips 120, 130 and 140, as well as the second, third and fourth memory pads 121, 131 and 141 may be same as those described in relation to the first nonvolatile memory chip 110 and the first memory pads 111.

The buffer chip 150 may communicate various signals between the first to fourth nonvolatile memory chips 110 to 140 (singularly or collectively) and the external device. That is, in some embodiments, the buffer chip 150 may communicate original (or raw) signals received from the external device to one or more of the first to fourth nonvolatile memory chips 110 to 140 without significant signal conversion. Alternately or additionally, the buffer chip 150 may perform various signal processing to improve the original signals receiver from the external device. Such "improvement" may include (e.g.,) improved compatibility, improved signal integrity (e.g., signal reshaping, noise reduction, or jitter reduction), improved timing (e.g., skew reduction) and/or improved power integrity (e.g., voltage/current level correction) for the signals communicated from the external device to the first to fourth nonvolatile memory chips 110 to 140 via the buffer chip 150. In this regard, the foregoing signal processing may variously improve the original signals without altering the content (or information—e.g., digital values or orders of digital values) of the original signals.

Alternately or additionally, the signal processing provided by the buffer chip 150 may include a signal swap that swaps first signals of (i.e., apparent at) the first buffer pads 151 and second signals of the second buffer pads 152. This type of "signal swap" may include a "direct communicate" of the first signals of the first buffer pads 151 to the second buffer pads 152 and/or a "selective communicate" in which one or more of the first signals of the first buffer pads 151 is selectively swapped—in terms of location(s) among the first buffer pads 151—and then communicated to the second buffer pads 152. In this regard, signal swapping may be used to improve signal integrity and/or power integrity by supporting signal mirroring at a package level of the memory package 100 (e.g., among components of the memory package 100 including the first to fourth nonvolatile memory chips 110 to 140).

Figure 3:
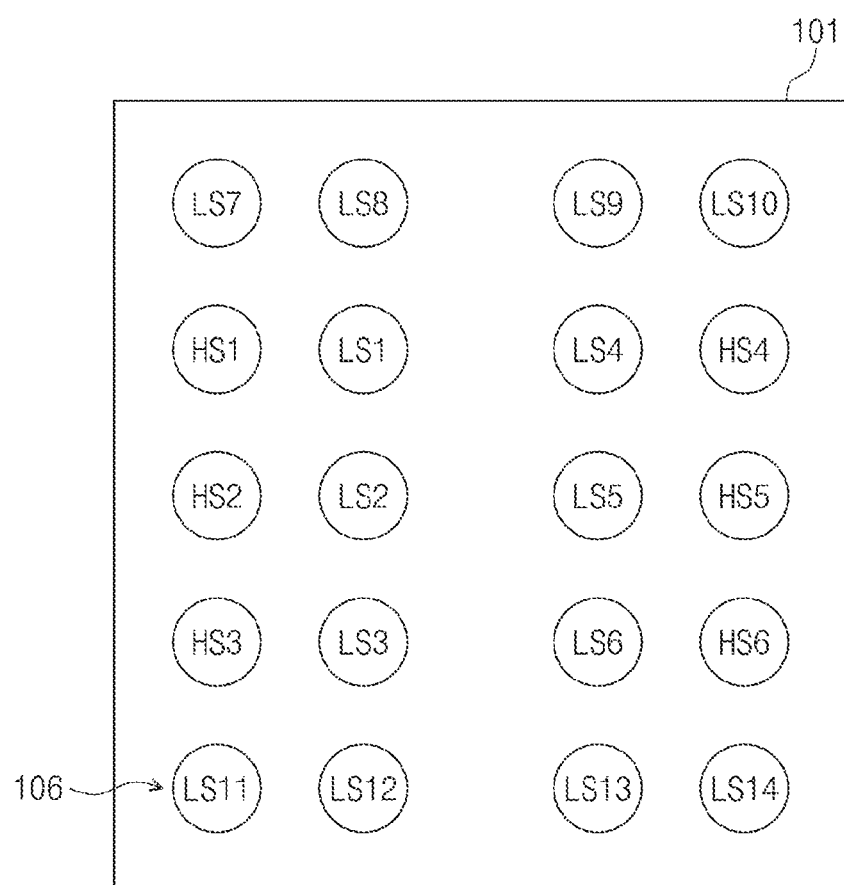
FIG. 3 is a plan (e.g., upper-down or lower-up) diagram further illustrating in one example a ball map for the solder balls 106 of the memory package 100 of FIGS. 1 and 2.

FIG. 3 is a plan diagram illustrating in one example a ball map for the solder balls 106 of the memory package 100 of FIGS. 1 and 2. Referring to FIGS. 1, 2 and 3, the solder balls 106 may be disposed under (e.g., on a lower surface of) the package substrate 101. The illustrated example of FIG. 3 assumes the inclusion of six (6) high-speed solder balls (e.g., first (HS1), second (HS2), third (HS3), fourth (HS4), fifth (HS5) and sixth (HS6)—hereafter collectively, "solder balls HS1 to HS6"), as well as fourteen (14) low-speed signal solder balls (e.g., analogously annotated "low-speed solder balls LS1 to LS14"). In this context, those skilled in the art will recognize that the term "solder ball" encompasses abroad range of electrically conductive elements capable of communicating one or more electrical signal(s).

In this regard, one or more of the first to sixth high-speed signal solder balls HS1 to HS6 may be used to communicate various "high-speed timing signal(s)" (e.g., clock(s) and/or data strobe(s)) that control the operational and/or inter-operational timing of circuitry associated with the first to fourth nonvolatile memory chips 110 to 140. Alternately or additionally, one or more of the first to sixth high-speed signal solder balls HS1 to HS6 may be used to communicate "high-speed signal(s)" that are related to (e.g., synchronous with) the high-speed timing signal(s). For example, certain high-speed signal(s) may be used to communicate information (e.g., data) synchronously with one or more of the high-speed timing signal(s) (e.g., high-speed timing signals defining a particular high-speed data rate (e.g., a Double Data Rate or DDR).

In contrast, one or more of the first to fourteenth low-speed signal solder balls LS1 to LS14 may be used to communicate certain "low-speed signal(s)", such as those commonly associated with operating modes (e.g., write protect, data masking, data inversion, etc.) as well as various "states" (e.g., enabled or disabled) for the operating modes. For example, low-speed signal(s) of the type communicated by one or more of the first to fourteenth low-speed signal solder balls LS1 to LS14 may indicate an enabled state or a disabled state when a corresponding event (e.g., receipt of a command, an address, and/or data) occurs. However, one or more of the first to fourteenth low-speed signal solder balls LS1 to LS14 may be used to communicate one or more low-speed signal(s) synchronously with a low-speed timing signal (e.g., a Single Data Rate or SDR).

In some embodiments, the first to sixth high-speed signal solder balls HS1 to HS6 may be used to communicate data signals DQ, a data strobe signal DQS, and/or a read enable signal RE. And the first to fourteenth low-speed signal solder balls LS1 to LS14 may be used to communicate one or more power signal(s) (e.g., a power supply voltage and/or ground voltage), a write protect signal WP, a command latch enable signal CLE, an address latch enable signal ALE, a chip enable signal CE, a ready and busy signal RnB, and/or a write enable signal WE.

With reference to the particular example illustrated in FIG. 3 and including first to sixth high-speed signal solder balls HS1 to HS6 and first to fourteenth low-speed signal solder balls LS1 to LS14, those skilled in the art will recognize that the number and corresponding locations of high-speed solder balls and/or low-speed signal solder balls will may vary with design. Further, the number and type of high-sped timing signals, high-speed signals, low-speed timing signals and low-speed signals may vary with design.

Figure 4:
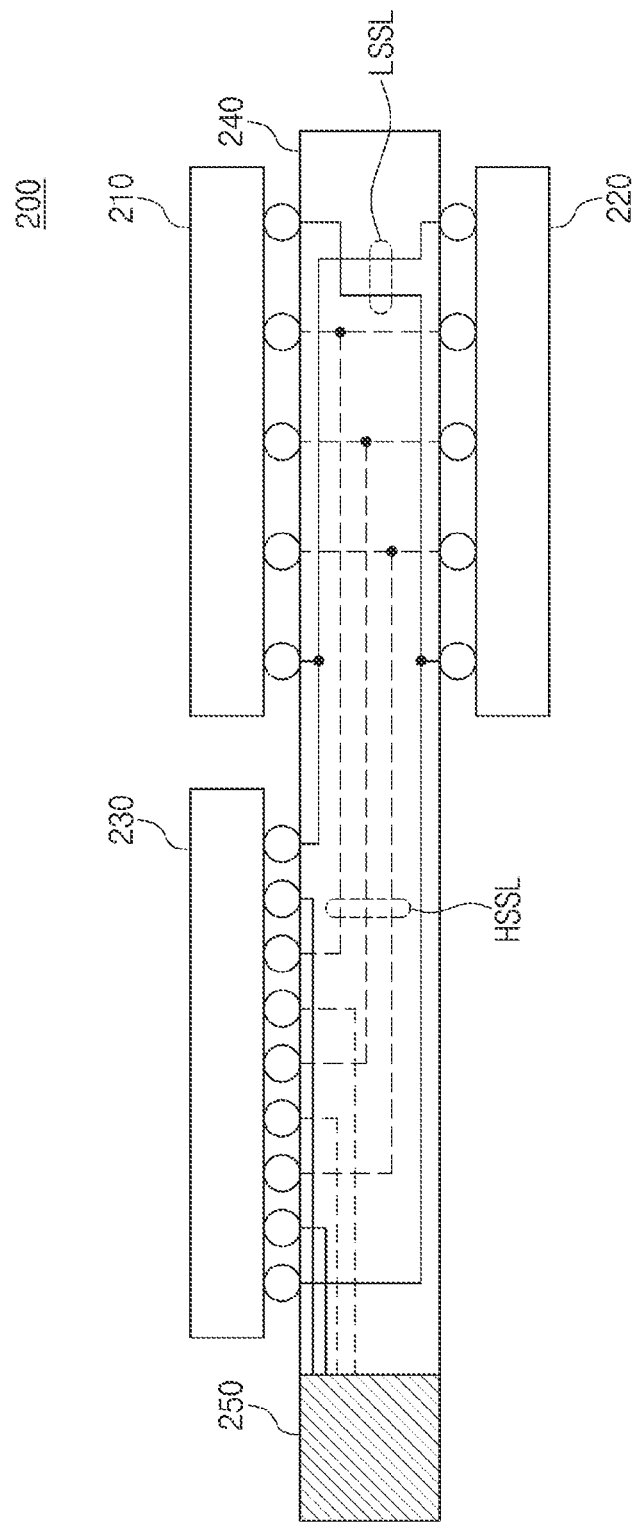
FIG. 4 is a cross-sectional diagram illustrating in one example a storage device 200 according to embodiments of the inventive concept, and FIG. 5 (and similarly FIG. 9) is plan diagram further illustrating examples of the first memory package 210 and the second memory package 220 of FIG. 4, as connected using a package mirroring technique.

FIG. 4 is a cross-sectional diagram illustrating a storage device 200 according to embodiments of the inventive concept. Referring to FIG. 4, the storage device 200 may include a first memory package 210, a second memory package 220, a controller package 230, a printed circuit board (PCB) 240 and a connector 250.

Each of the first memory package 210 and the second memory package 220 may be similarly configured to the memory package 100 of FIGS. 1, 2 and 3. In the illustrated example of FIG. 4, the first memory package 210 is disposed on an upper surface of the PCB 240 and the second memory package 220 is disposed on a lower surface of the PCB 240 in an "opposing" manner (e.g., lower surface facing lower surface across the PCB 240) with respect to the first memory package 210. In this configuration, the first memory package 210 and the second memory package 220 may be readily connected to the PCB 240 using solder balls.

The controller package 230 may be provided on the upper and/or lower surface of the PCB 240, wherein the controller package 230 may be selectively connected through the PCB 240 to the solder balls and used to control the overall operation of the first memory package 210 and the second memory package 220 in response to requests (or commands) received from the external device. In this regard, the controller package 230 may "communicate" (e.g., communicate and/or receive) signals including command(s), address(es), data and/or control signals between the first memory package 210 and/or the second memory package 220 and the external device in relation to various memory access operations, such as write operations, read operations, erase operations, housekeeping operations, etc.

That is, the controller package 230 may variously communicate with the external device through the connector 250, such that the controller package 230 may receive a request (e.g., a read or a write request) from the external device through the connector 250, and then access the first memory package 210 and/or the second memory package 220 in response to the request.

The PCB 240 may include various wires, wiring, through vias, etc. (hereafter, singularly or collectively "wires") connecting the first memory package 210 and the second memory package 220 with the controller package 230, and further connecting the controller package 230 with the connector 250. For example, so-called "high-speed signal wires" (HSSL shown by the dotted lines in FIG. 4) may be used to communicate high-speed signal(s) between the controller package 230 and the first memory package 210 and the second memory package 220. Relative to the illustrated example of FIG. 3, the HSSL may be connected with the first to sixth high-speed signal solder balls HS1 to HS6 of the first memory package 210 and/or the first to sixth high-speed signal solder balls HS1 to HS6 of the second memory package 220. Additionally, so-called low-speed signal wires (or LSSL shown by the solid lines in FIG. 4) may communicate low-speed signal(s) between the controller package 230 and the first memory package 210 and the second memory package 220. For example, the low-speed signal wires LSSL may be connected with the first to fourteenth low-speed signal solder balls LS1 to LS14 of the first memory package 210 or the second memory package 220.

As technologies enabling the manufacture of evermore powerful storage devices have developed, the frequency of various timing signals in storage devices have increased. And as the frequency of storage device timing signals have increased, the influence on performance of PCB signal transmission path(s) (e.g., delay, noise, etc.) on signal integrity and power integrity of various signals has also increased.

For example, referring to FIG. 4, the first memory package 210 and the second memory package 220 may be respectively disposed on upper and lower surfaces of the PCB 240. Here, a first length of a first wire extending from the controller package 230 to the first memory package 210 may be different than a second length of a second wire extending from the controller package 230 to the second memory package 220. Such different lengths may result in different arrival times for signals respectively communicated via the first wire and the second wire. This is particularly true for high-speed signals. Further, different signal times of flight may result in signal interference and possible loss of signal information.

To prevent such outcomes, and as illustrated in FIG. 4, the storage device 200 may be configured using a technique called "package mirroring" in which the first memory package 210 and the second memory package 220 are substantially vertically aligned one above the other, and respectively disposed on the upper and lower surfaces of the PCB 240. As a result, at least some of first wires (or first signal paths) extending between the controller package 230 and the first memory package 210 and at least some of second wires (or second signal paths) extending between the controller package 240 and the second memory package 220 may be configured in mirroring arrangements. In some embodiments, the mirrored wires (or mirrored signal paths) among the first signal paths and the second signal paths may be used to communicate high-speed signals. That is, the mirrored signal paths among the first signal paths and the second signal paths may be used as HSSL to communicate high-speed signals from the package controller 230 to the first memory package 210 and the second memory package 220. By using package mirroring, differences between analogous wire lengths (or signals paths) communicating at least certain high-speed signals may be minimized, thereby improving signal integrity and power integrity for signals associated with the storage device 200.

In contrast and as further illustrated in FIG. 4, wires (or signal paths) communicating low-speed signals (e.g., LSSL) need not necessarily be arranged in a mirroring arrangement, since differences in wire (or signal path) lengths do not adversely influence the transmission of the low-speed signals between the package controller 230 and the first memory package 210 and between the package controller 230 and the second memory package 220.

Figure 5:
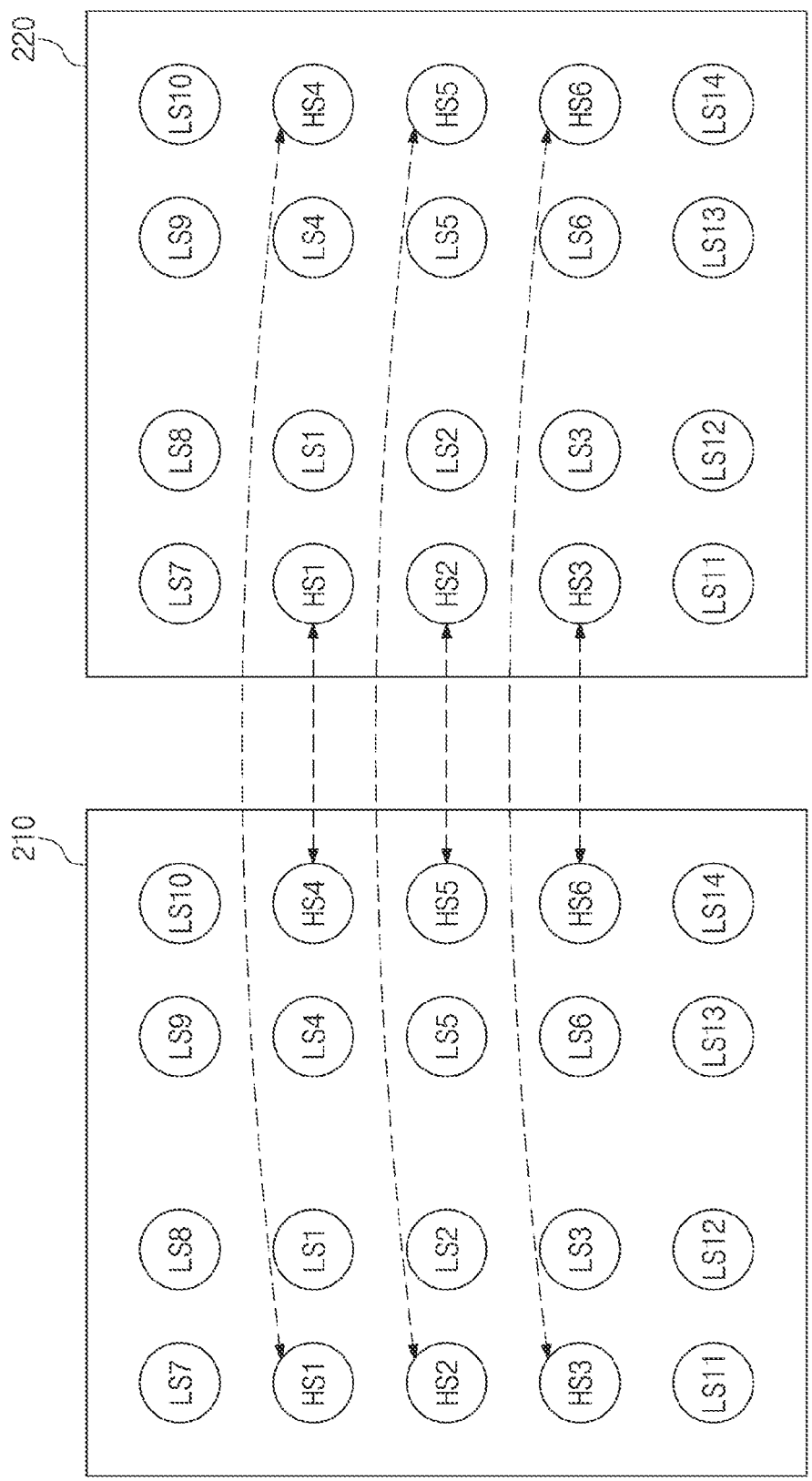

FIG. 5 is a plan diagram illustrating in one example a package mirroring arrangement between the first memory package 210 and the second memory package 220 of FIG. 4. Referring to FIGS. 4 and 5, because the first memory package 210 and the second memory package 220 are disposed in substantial alignment on upper and lower surfaces of the PCB 240, a first arrangement of solder balls associated with the first memory package 210 will be mirrored (i.e., reversed as if seen in a facing mirror) by a second arrangement of solder balls associated with the second memory package 220. (Thus, the laterally adjacent disposition of the first arrangement of solders balls associated with the first memory package 210 and the second arrangement of solder balls associated with the second memory package 220 should be viewed vertically adjacent above and below the PCB 240).

It follows that high-speed signal wires (HSSL) will be connected to the first memory package 210 and to second memory package 220 at analogous (i.e., geometrically similar) locations with respect to the PCB 240. That is, the first to sixth high-speed signal solder balls HS1 to HS6 of the first memory package 210 and the first to sixth high-speed signal solder balls HS1 to HS6 of the second memory package 220 will be respectively and vertically aligned above and below the PCB 240. For example, as illustrated in FIG. 5, the first to third high-speed signal solder balls HS1 to HS3 of the first memory package 210 may be respectively connected with the fourth to sixth high-speed signal solder balls HS4 to HS6 of the second memory package 220, And the fourth to sixth high-speed signal solder balls HS4 to HS6 of the first memory package 210 may be respectively connected with the first to third high-speed signal solder balls HS1 to HS3 of the second memory package 220.

Figure 6:
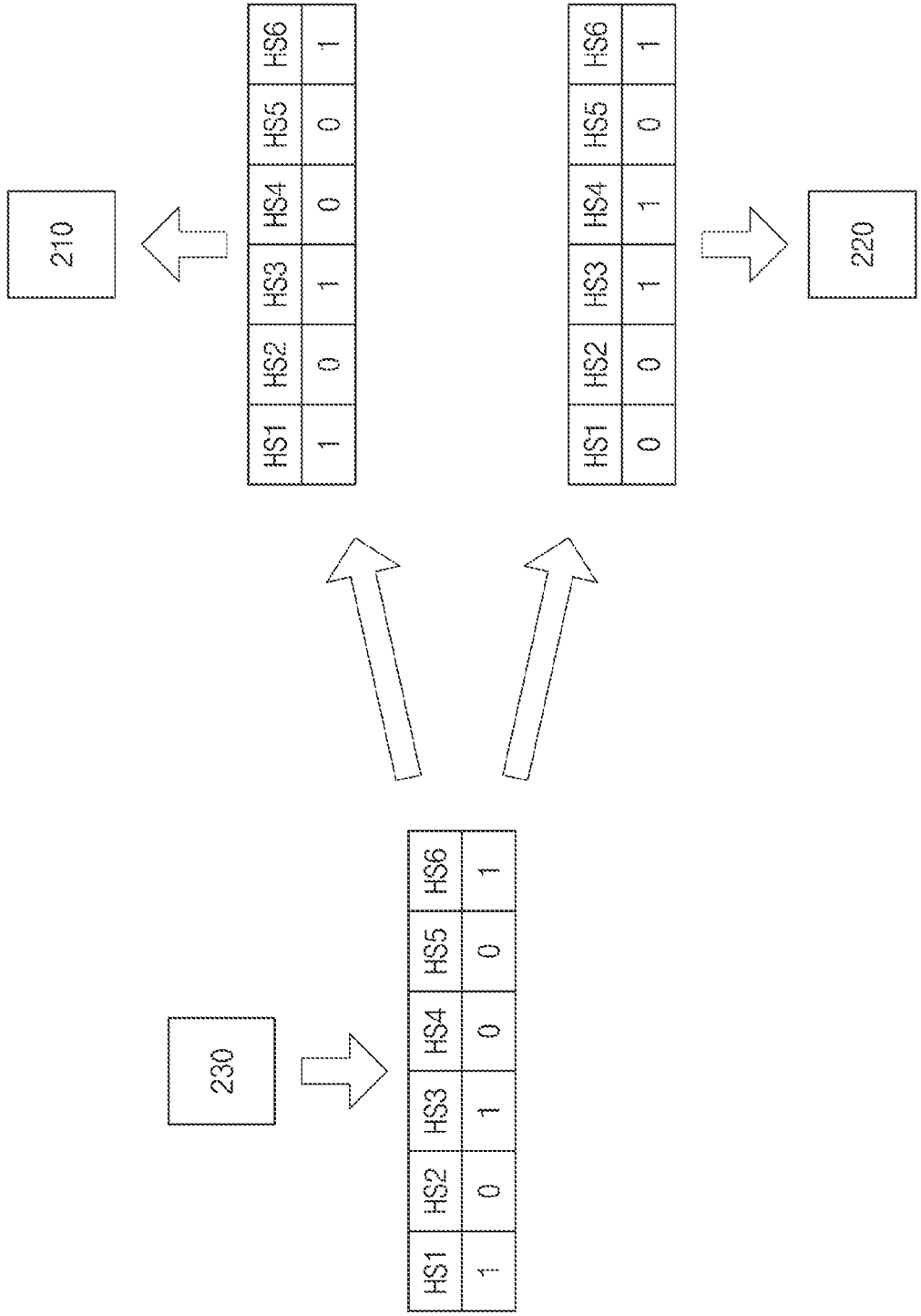
FIG. 6 is a conceptual diagram illustrating an example in which high-speed signals output by the controller package 230 are communicated to the first memory package 210 and the second memory package 220 in the storage device 200 of FIGS. 4 and 5.

FIG. 6 is a conceptual diagram further illustrating in one example high-speed signal paths (or signal connections arranged according to package mirroring) between the controller package 230 and the first memory package 210 and between the controller package 230 and the second memory package 220 in the storage device 200 of FIGS. 4 and 5. Referring to FIGS. 4, 5, and 6, the controller package 230 is assumed to output bit values of "101001" respectively through the first to sixth high-speed signal solder balls HS1 to HS6.

In the illustrated embodiment of FIG. 6, the first to sixth high-speed signal solder balls HS1 to HS6 of the first memory package 210 may be respectively connected with the first to sixth high-speed signal solder balls HS1 to HS6 of the controller package 230. Accordingly, the first arrangement of solder balls (e.g., the first to sixth high-speed signal solder balls HS1 to HS6) associated with the first memory package 210 (which is disposed on the upper surface of the PCB together with the package controller 230) will readily and respectively receive the communicated bits as "101001".

However, as described in relation to FIG. 5, the second memory package 220 is disposed in a mirroring arrangement on the lower surface of the PCB 240. Hence, the first to third high-speed signal solder balls HS1 to HS3 of the second memory package 220 will be respectively connected with the fourth to sixth high-speed signal solder balls HS4 to HS6 of the first memory package 210, and the fourth to sixth high-speed signal solder balls HS4 to HS6 of the second memory package 220 may be respectively connected with the first to third high-speed signal solder balls HS1 to HS3 of the first memory package 210. Accordingly, the second arrangement of solder balls (e.g., the first to sixth high-speed signal solder balls HS1 to HS6) associated with the second memory package 220 will incorrectly receive the communicated bits as "001101".

To remedy this outcome, a swapping operation may be performed in relation to the second memory package 220 that selectively swaps signals received at the first to third high-speed signal solder balls HS1 to HS3 with signals received at the fourth to sixth high-speed signal solder balls HS4 to HS6. Hence, the swapping operation has the effect of normalizing the receipt of signals at the second arrangement of solder balls associated with the second memory package 220 with the receipt of the signals at the first arrangement of solder balls associated with the first memory package 210.

In this regard, the swapping operation may be performed, as needed, by respective memory package(s) provided by the first to fourth nonvolatile memory chips 110 to 140 of FIGS. 1 and 2. However, performance of the swapping operation may require certain structural change(s) in the first to fourth nonvolatile memory chips 110 to 140 that increase the overall cost of the storage device 200.

To avoid increased costs, embodiments of the inventive concept provide the buffer chip 150 of FIGS. 1 and 2 that may be configured to perform a swapping operation that selectively swaps signals in the buffer chip 150 to-be-communicated to the first to third high-speed signal solder balls HS1 to HS3 and/or to the fourth to sixth high-speed signal solder balls HS4 to HS6. Thus, the buffer chip 150 may be configured to arrange the communication of various signals the first to fourth nonvolatile memory chips 110 to 140 in such a manner that signal integrity and power integrity are protected. In this regard, the structure of the buffer chip 150 may be relatively simple, as compared with the structure of the first to fourth nonvolatile memory chips 110 to 140. Accordingly, the structure and functionality of the buffer chip 150 may be configured to avoid costly changes to the structure and/or functionality of the first to fourth nonvolatile memory chips 110 to 140.

Figure 7:
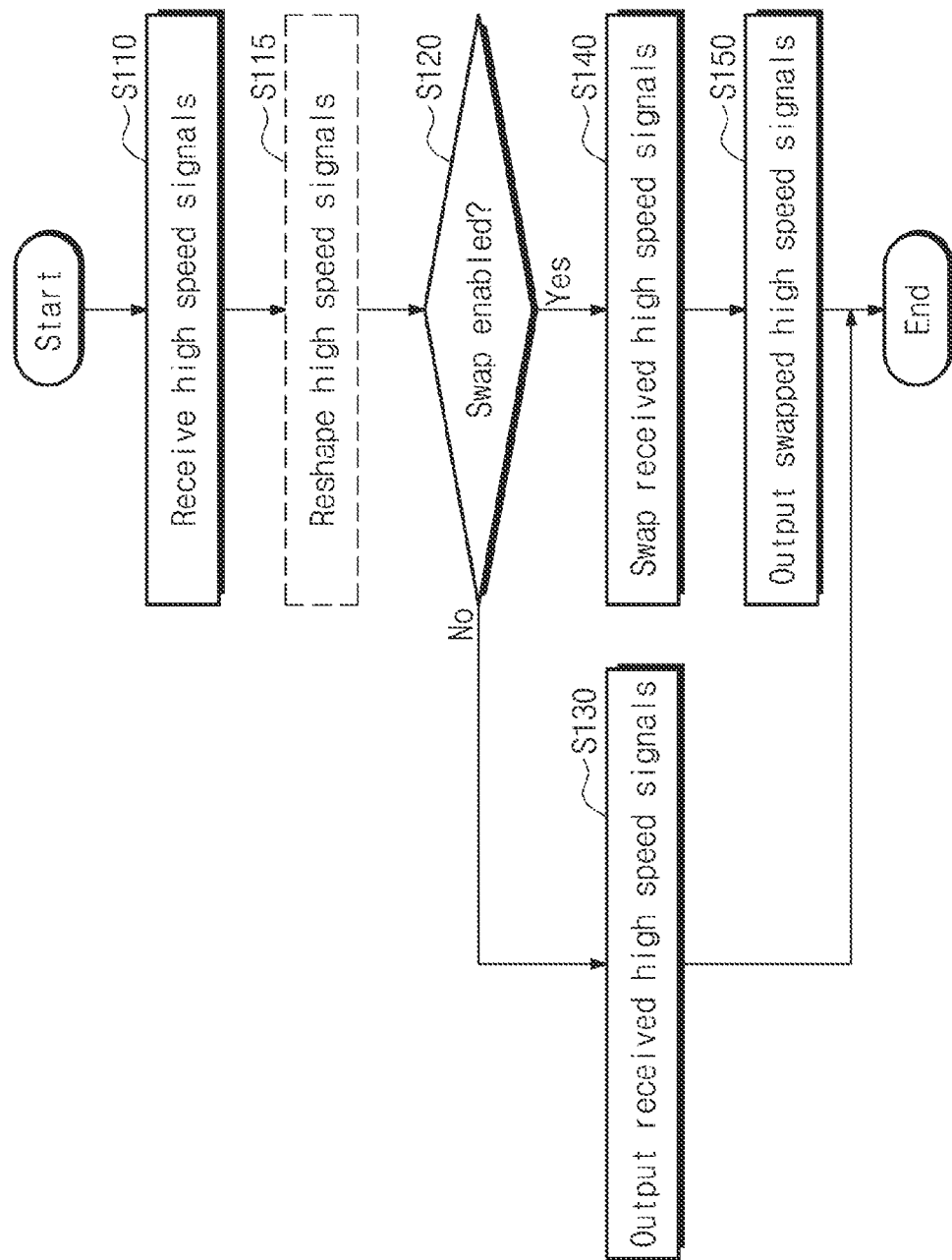
FIG. 7 is a flowchart illustrating in one example an operating method of a buffer chip according to embodiments of the inventive concept.

FIG. 7 is a flow chart illustrating in one example an operating method for the buffer chip 150 of FIGS. 1 and 2 according to embodiments of the inventive concept. Referring to FIGS. 1, 2, and 7, the buffer chip 150 may receive high-speed signals through the first to sixth high-speed signal solder balls HS1 to HS6 (S110). Optionally, the buffer chip 150 may perform certain signal processing such as reshaping of high-speed signals (S115). Here, "reshaping" may refer to changing toggle timing of timing signal(s), changing toggle timing of information signal(s), adjusting for jitter, adjusting for skew, etc.

Once the high-speed signals are received (and optionally reshaped), the buffer chip 150 may determine whether a swap is enabled (S120). When it is determined that the swap is not enabled (S120=NO), the buffer chip 150 may output the high-speed signal received via the first to sixth high-speed signal solder balls HS1 to HS6 to the first to fourth nonvolatile memory chips 110 to 140 without performing a swap operation (S130).

However, when it is determined that the swap is enabled (S120=YES), the buffer chip 150 may perform a swap operation on (or hereafter, "swap") the high-speed signals to generate swapped high-speed signals. For example, the buffer chip 150 may swap signals received via the first to third high-speed signal solder balls HS1 to HS3 with signals received via the fourth to sixth high-speed signal solder balls HS4 to HS6 (S140). Then, the buffer chip 150 may output the swapped high-speed signals to the first to fourth nonvolatile memory chips 110 to 140 (S150).

Figure 8:
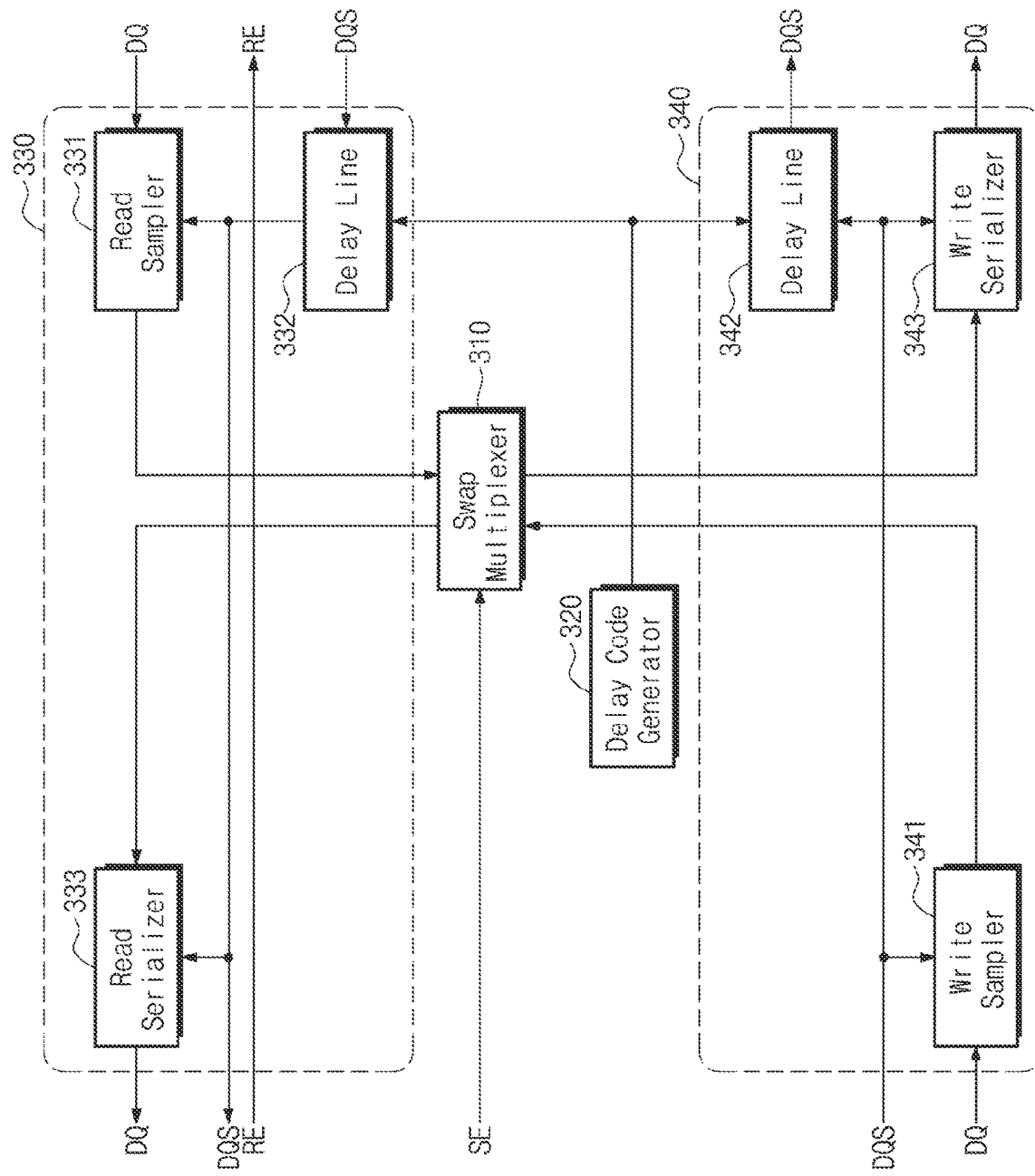
FIGS. 8, 10, 11, 12, 13, 14 and 15 are respective block diagrams variously illustrating examples (300, 400, 500, 600, 700, 800 and 900) of a buffer chip according to embodiments of the inventive concept.

FIG. 8 is a block diagram illustrating a buffer chip 300 according to embodiments of the inventive concept. Referring to FIGS. 1, 2, 4, and 8, the buffer chip 300 may correspond to the buffer chip 150 of FIGS. 1 and 2. The buffer chip 300 may include a swap multiplexer 310, a delay code generator 320, read elements 330, and write elements 340.

The swap multiplexer 310 may receive a swap enable signal SE from an external source outside of the buffer chip 300. The swap multiplexer 310 may receive data signals DQ from the read elements 330. When the swap enable signal SE is disabled, the swap multiplexer 310 may return the data signals DQ to the read elements 330 without the swap. When the swap enable signal SE is enabled, the swap multiplexer 310 may swap the data signals DQ and may return the swapped data signals DQ to the read elements 330.

The swap multiplexer 310 may receive the data signals DQ from the write elements 340. When the swap enable signal SE is disabled, the swap multiplexer 310 may return the data signals DQ to the write elements 340 without the swap. When the swap enable signal SE is enabled, the swap multiplexer 310 may swap the data signals DQ and may return the swapped data signals DQ to the write elements 340.

The delay code generator 320 may generate a delay code for synchronization between the data signals DQ and the data strobe signals DQS. The delay code generator 320 may communicate the delay code to the read elements 330 and the write elements 340.

The read elements 330 may receive the read enable signal RE from the controller package 230 and may output the received read enable signal RE to the first to fourth nonvolatile memory chips 110 to 140. The read enable signal RE may be included in the timing signal(s) described above.

The read elements 330 may receive the data signals DQ and the data strobe signals DQS from the first to fourth nonvolatile memory chips 110 to 140. The data signals DQ may be included in the signal(s) or the information signal(s) communicating information, which are described above. The data strobe signals DQS may be included in the timing signal(s) described above. The read elements 330 may output the data signals DQ and the data strobe signals DQS to the controller package 230.

The read elements 330 may include a read sampler 331, a delay line 332, and a read serializer 333. The read sampler 331 may sample the data signals DQ in synchronization with the data strobe signals DQS output from the delay line 332. The sampled data signals may be communicated to the swap multiplexer 310.

The delay line 332 may delay the data strobe signals DQS communicated from the first to fourth nonvolatile memory chips 110 to 140 in response to the delay code communicated from the delay code generator 320. In some embodiments, the centers of the data signals DQ output from the first to fourth nonvolatile memory chips 110 to 140 may be respectively synchronized with the centers of the data strobe signals DQS. The delay line 332 may delay and output the data strobe signals DQS communicated from the first to fourth nonvolatile memory chips 110 to 140 such that the centers of the data signals DQ are synchronized with the edges of the data strobe signals DQS.

The read serializer 333 may receive data signals, which are swapped or are not swapped, from the swap multiplexer 310. The read serializer 333 may serialize the data signals communicated from the swap multiplexer 310 in synchronization with the data strobe signals DQS communicated from the delay line 332, so as to be output as the data signals DQ. In some embodiments, the centers of the data signals DQ output from the read serializer 333 may be respectively synchronized with the centers of the data strobe signals DQS output from the delay line 332.

In some embodiments, each of the first to fourth nonvolatile memory chips 110 to 140 may delay the read enable signal RE to generate the data strobe signals DQS. A waveform of the data strobe signals DQS may be the same as a waveform of the read enable signal RE and may be delayed with respect to the waveform of the read enable signal RE. The read enable signal RE may toggle when the read elements 330 are activated depending on a read command and may have a fixed level when the read elements 330 are not activated.

The write elements 340 may receive the data signals DQ and the data strobe signals DQS from the controller package 230. The write elements 340 may communicate the data signals DQ and the data strobe signals DQS to the first to fourth nonvolatile memory chips 110 to 140.

The write elements 340 may include a write sampler 341, a delay line 342, and a write serializer 343. The write sampler 341 may sample the data signals DQ in synchronization with the data strobe signals DQS output from the controller package 230. The sampled data signals may be communicated to the swap multiplexer 310.

The delay line 342 may delay the data strobe signals DQS communicated from the controller package 230 in response to the delay code communicated from the delay code generator 320. The delay line 342 may output delayed versions of the data strove signals to the first to fourth nonvolatile memory chips 110 to 140. In some embodiments, centers of the data signals DQ output from the controller package 230 may be synchronized with edges of the data strobe signals DQS. The delay line 342 may delay and output the data strobe signals DQS output from the controller package 230 such that the centers of the data signals DQ output from the write serializer 343 are synchronized with edges of the data strobe signals DQS output from the delay line 342.

The write serializer 343 may receive data signals, which are swapped or are not swapped, from the swap multiplexer 310. The write serializer 343 may serialize the data signals communicated from the swap multiplexer 310 in synchronization with the data strobe signals DQS communicated from the controller package 230, so as to be output as the data signals DQ.

In some embodiments, the data signals DQ output from the read elements 330 and the data signals DQ received by the write elements 340 may be exchanged via analogous (or common) solder balls (e.g., high-speed signal solder balls) between the controller package 230 and the buffer chip 300. The data strobe signals DQS output from the read elements 330 and the data strobe signals DQS received by the write elements 340 may be exchanged through common solder balls (e.g., high-speed signal solder balls) between the controller package 230 and the buffer chip 300.

The data signals DQ received by the read elements 330 and the data signals DQ output from the write elements 340 may be exchanged via analogous (or common) pads between the buffer chip 300 and the first to fourth nonvolatile memory chips 110 to 140. The data strobe signals DQS received by the read elements 330 and the data strobe signals DQS output from the write elements 340 may be exchanged via analogous (or common) pads between the buffer chip 300 and the first to fourth nonvolatile memory chips 110 to 140.

The data strobe signals DQS may toggle when the read elements 330 or the write elements 340 are activated in response to a read command or a write command and may have a fixed level when the read elements 330 or the write elements 340 are deactivated. The data strobe signals DQS may be distinguished from an always toggling clock signal in that the data strobe signals DQS toggles only as required.

In some embodiments, a period of the data signals DQ when passing through the read sampler 331 may increase (e.g., by two times), and a period of the data signals DQ when passing through the read serializer 333 may decrease (e.g., by one half). Likewise, a period of the data signals DQ when passing through the write sampler 341 may increase (e.g., by two times), and a period of the data signals DQ when passing through the write serializer 343 may decrease (e.g., by one half). The swap multiplexer 310 may perform the swap more stably and more accurately by performing the swap between the read sampler 331 and the read serializer 333 and between the write sampler 341 and the write serializer 343.

Figure 9:
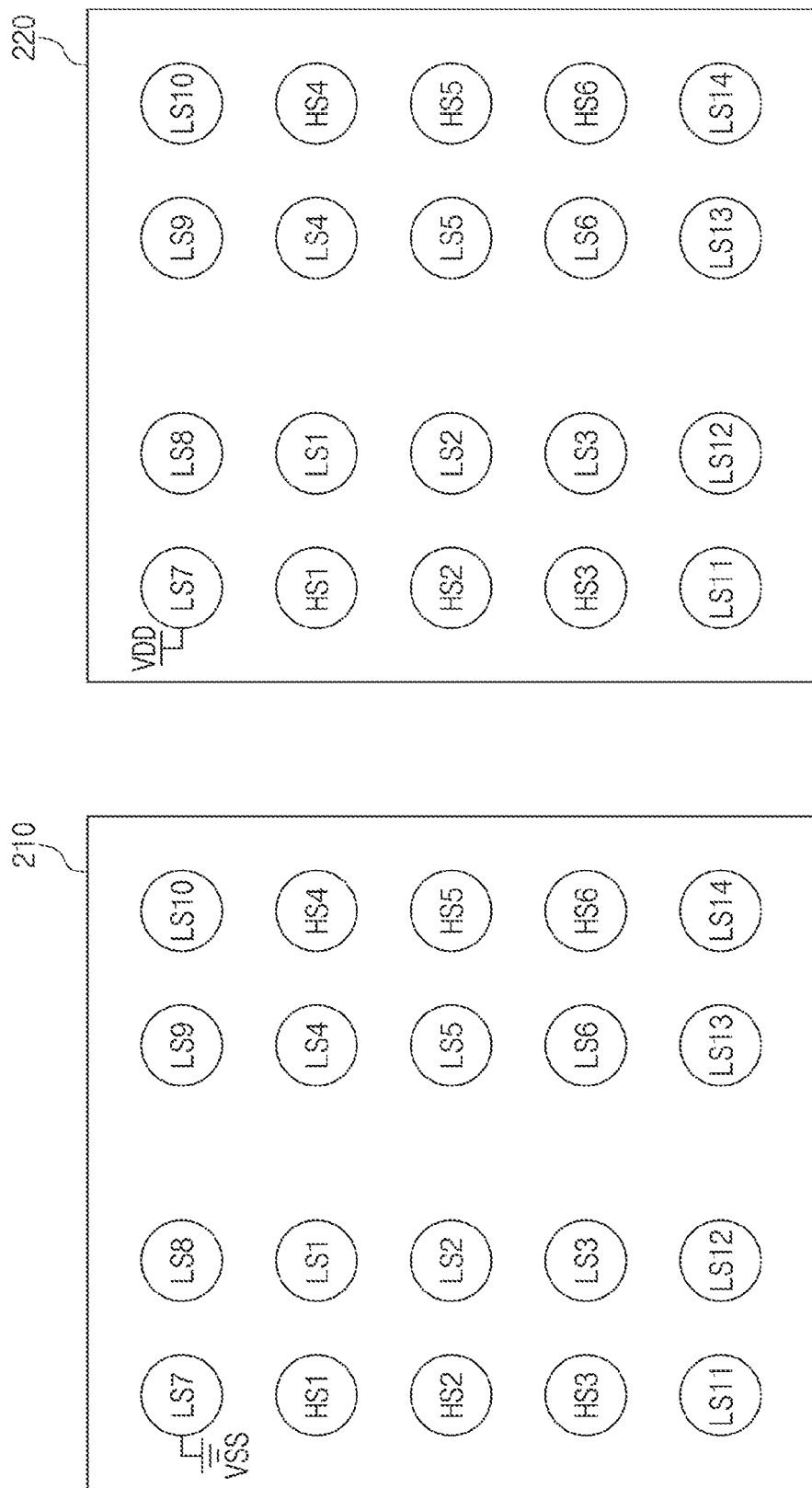

FIG. 9 is a plan diagram illustrating in one example a method by which the swap enable signal SE may be communicated to the buffer chip 150. Referring to FIGS. 1, 2, 4, and 9, at least one low-speed signal solder ball (e.g., LS7) of the first memory package 210 may be biased to a voltage having a first level (e.g., a ground or VSS), and at least one low-speed signal solder ball (e.g., LS7) of the second memory package 220 may be biased to a voltage having a second level (e.g., a power supply voltage VDD).

When the low-speed signal solder ball (e.g., LS7) is set to VSS, the swap enable signal SE may be identified as disabled. When the low-speed signal solder ball (e.g., LS7) is set to VDD, the swap enable signal SE may be identified as enabled. That is, the buffer chip 150 of the first memory package 210 will not perform the swap, whereas the buffer chip 150 of the second memory package 220 will perform the swap.

In some embodiments, VSS and VDD may be readily provided from the controller package 230 to the first memory package 210 and the second memory package 220. For another example, VSS and VDD may bypass the controller package 230, and be directly communicated from the connector 250 to the first memory package 210 and the second memory package 220.

In some embodiments, the enable/disable state of the swap enable signal SE may be identified by a waveform of a signal communicated to at least one solder ball of the first memory package 210 or at least one solder ball of the second memory package 220, and not simply as the level of a particular voltage communicated to the at least one solder ball. The waveform of the signal may include at least one transition point at which a transition is made from a high level and a low level. In response to a first waveform being communicated, the first memory package 210 or the second memory package 220 may identify an enabled swap enable signal SE, and in response to a second waveform, different from the first waveform, being communicated, the first memory package 210 or the second memory package 220 may identify a disabled swap enable signal SE.

In some embodiments, the first buffer pads 151 of the buffer chip 150 may include at least one pad receiving a signal from at least one solder ball. A signal apparent at the at least one solder ball need not be communicated to the first to fourth nonvolatile memory chips 110 to 140. Accordingly, the second buffer pads 152 of the buffer chip 150 may not include at least one pad used to communicate the signal from the at least one solder ball.

Figure 10:
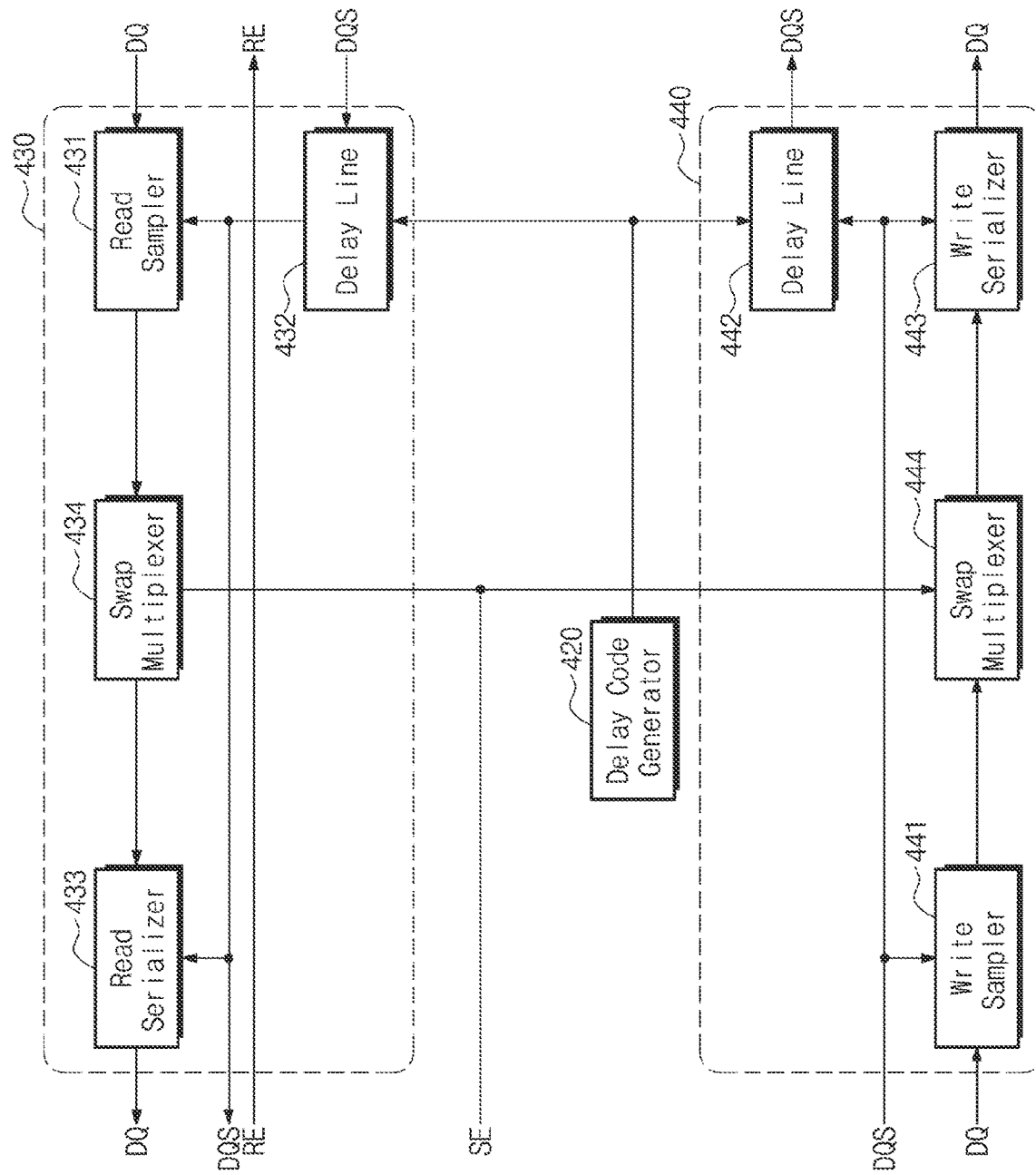

FIG. 10 is a block diagram illustrating a buffer chip 400 according to embodiments of the inventive concept. Referring to FIGS. 1, 2, 4, and 10, the buffer chip 400 may correspond to the buffer chip 150 of FIGS. 1 and 2. The buffer chip 400 may include a delay code generator 420, read elements 430, and write elements 440.

Compared to the buffer chip 300 of FIG. 8, the swap multiplexer 310 may be divided into a first swap multiplexer 434 and a second swap multiplexer 444 so as to be disposed at the read elements 430 and the write elements 440, respectively. The first swap multiplexer 434 may receive data signals sampled by a read sampler 431 and may perform or omit the swap in response to the swap enable signal SE. The first swap multiplexer 434 may communicate the data signals, which are swapped or are not swapped, to a read serializer 433.

The second swap multiplexer 444 may receive data signals sampled by a write sampler 441 and may perform or omit the swap in response to the swap enable signal SE. The second swap multiplexer 444 may communicate the data signals, which are swapped or are not swapped, to a write serializer 443.

The respective structures and functions of the delay code generator 420, the read sampler 431, a delay line 432, the read serializer 433, the write sampler 441, a delay line 442, and the write serializer 443 may be the same as those of the delay code generator 320, the read sampler 331, the delay line 332, the read serializer 333, the write sampler 341, the delay line 342, and the write serializer 343 described in relation to FIG. 8.

Figure 11:
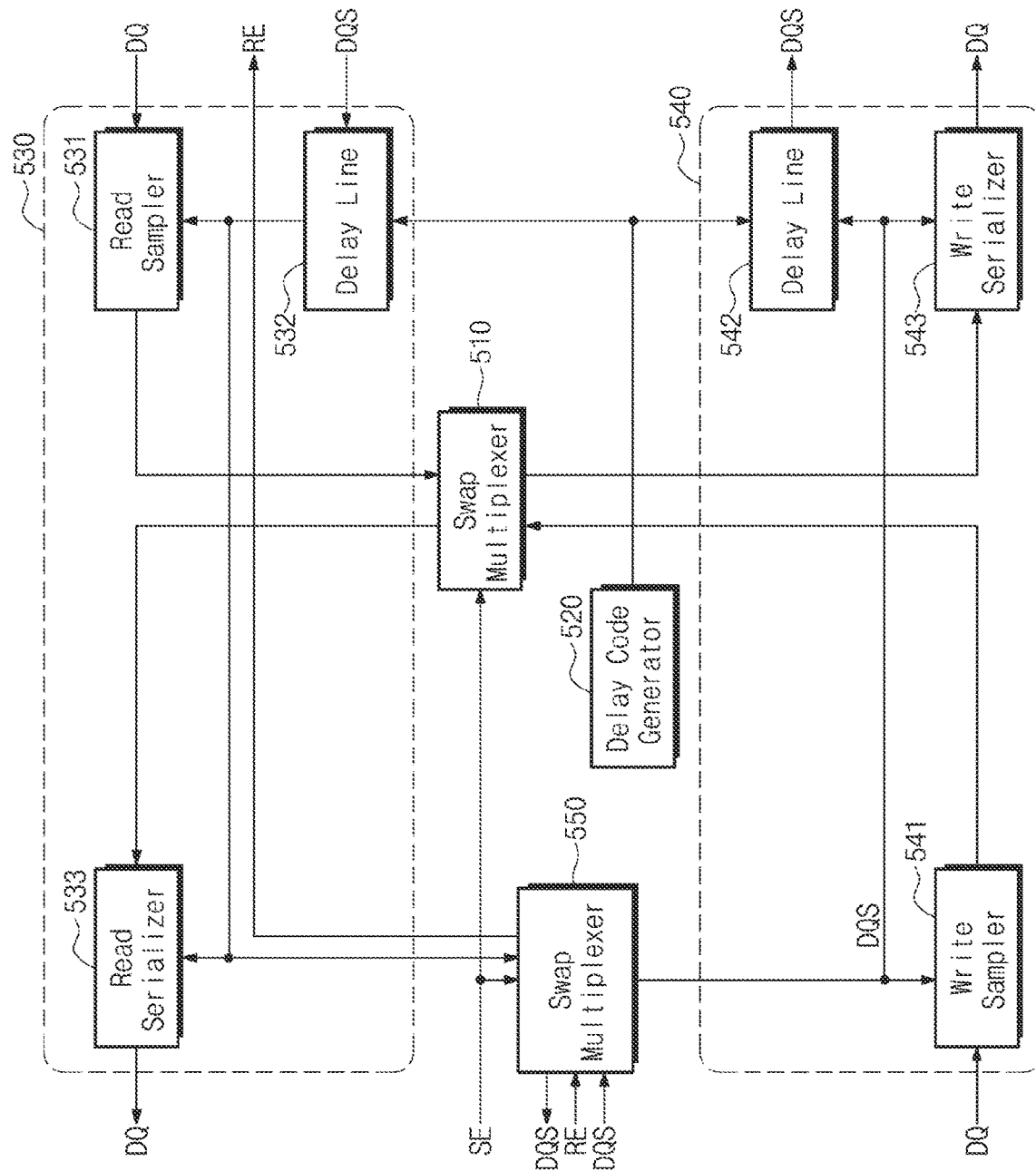

FIG. 11 is a block diagram illustrating a buffer chip 500 according to embodiments of the inventive concept. Referring to FIGS. 1, 2, 4, and 11, the buffer chip 500 may correspond to the buffer chip 150 of FIGS. 1 and 2. The buffer chip 500 may include a swap multiplexer 510, a delay code generator 520, read elements 530, write elements 540, and a timing signal swap multiplexer 550.

Compared with the buffer chip 300 of FIG. 8, the buffer chip 500 may further include the timing signal swap multiplexer 550. The timing signal swap multiplexer 550 may receive the read enable signal RE and the data strobe signals DQS from the controller package 230. The timing signal swap multiplexer 550 may output the read enable signal RE to the read elements 530 and may output the data strobe signals DQS to the write elements 540.

The timing signal swap multiplexer 550 may receive the data strobe signals DQS from the read elements 530. The timing signal swap multiplexer 550 may output the data strobe signals DQS to the controller package 230. The timing signal swap multiplexer 550 may selectively perform the swap of timing signals between the controller package 230 and the read elements 530 and between the controller package 230 and the write elements 540.

The data strobe signal DQS that is received from the controller package 230 and is swapped or is not swapped by the timing signal swap multiplexer 550 may be communicated to a write sampler 541. The read enable signal RE that is received from the controller package 230 and is swapped or is not swapped by the timing signal swap multiplexer 550 may be communicated to the first to fourth nonvolatile memory chips 110 to 140 through the read elements 530. The data strobe signals DQS that are received from the read elements 530 and are swapped or are not swapped by the timing signal swap multiplexer 550 may be communicated to the controller package 230.

The respective structures and functions of the swap multiplexer 510, the delay code generator 520, the read elements 530 including a read sampler 531, a delay line 532, and a read serializer 533, and the write elements 540 including the write sampler 541, a delay line 542, and a write serializer 543 may be the same as those of the swap multiplexer 310, the delay code generator 320, the read elements 330 including the read sampler 331, the delay line 332, and the read serializer 333, and the write elements 340 including the write sampler 341, the delay line 342, and the write serializer 343 described in relation to FIG. 8.

In some embodiments, as described with reference to FIG. 10, the swap multiplexer 510 may be divided into two swap multiplexers so as to be disposed at the read elements 530 and the write elements 540, respectively. Also, the timing signal swap multiplexer 550 may be divided into two swap multiplexers so as to be disposed at the read elements 530 and the write elements 540, respectively.

Figure 12:
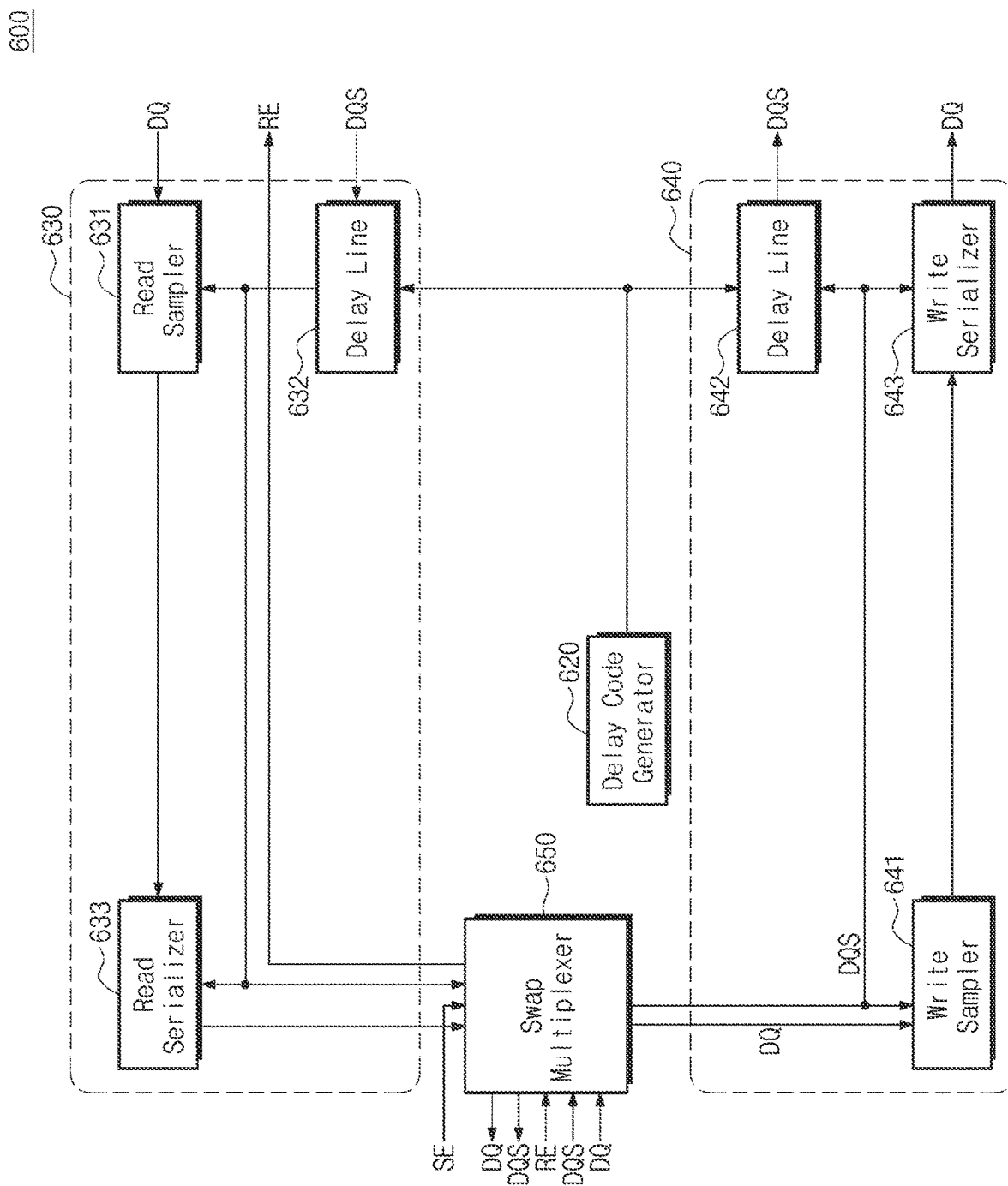

FIG. 12 is a block diagram illustrating a buffer chip 600 according to embodiments of the inventive concept. Referring to FIGS. 1, 2, 4, and 12, the buffer chip 600 may correspond to the buffer chip 150 of FIGS. 1 and 2. The buffer chip 600 may include a delay code generator 620, read elements 630, write elements 640, and an integrated swap multiplexer 650.

The integrated swap multiplexer 650 may perform or omit the swap of the data signals DQ, the data strobe signals DQS, and the read enable signal RE in response to the swap enable signal SE. The integrated swap multiplexer 650 may selectively perform the swap of timing signals between the controller package 230 and the read elements 630 and between the controller package 230 and the write elements 640.

The swap of timing signals including the data strobe signals DQS and the read enable signal RE may be performed the same as that described with reference to the timing signal swap multiplexer 550 of FIG. 11. The swap of the data signals DQ may be performed between the read elements 630 and the controller package 230 or between the write elements 640 and the controller package 230 to be the same as that described with reference to FIG. 8.

The respective structures and functions of the delay code generator 620, the read elements 630 including a read sampler 631, a delay line 632, and a read serializer 633, and the write elements 640 including a write sampler 641, a delay line 642, and a write serializer 643 may be the same as those of the delay code generator 320, the read elements 330 including the read sampler 331, the delay line 332, and the read serializer 333, and the write elements 340 including the write sampler 341, the delay line 342, and the write serializer 343 described in relation to FIG. 8.

In some embodiments, as described with reference to FIG. 10, the integrated swap multiplexer 650 may be divided into two swap multiplexers so as to be disposed at the read elements 630 and the write elements 640, respectively.

Figure 13:
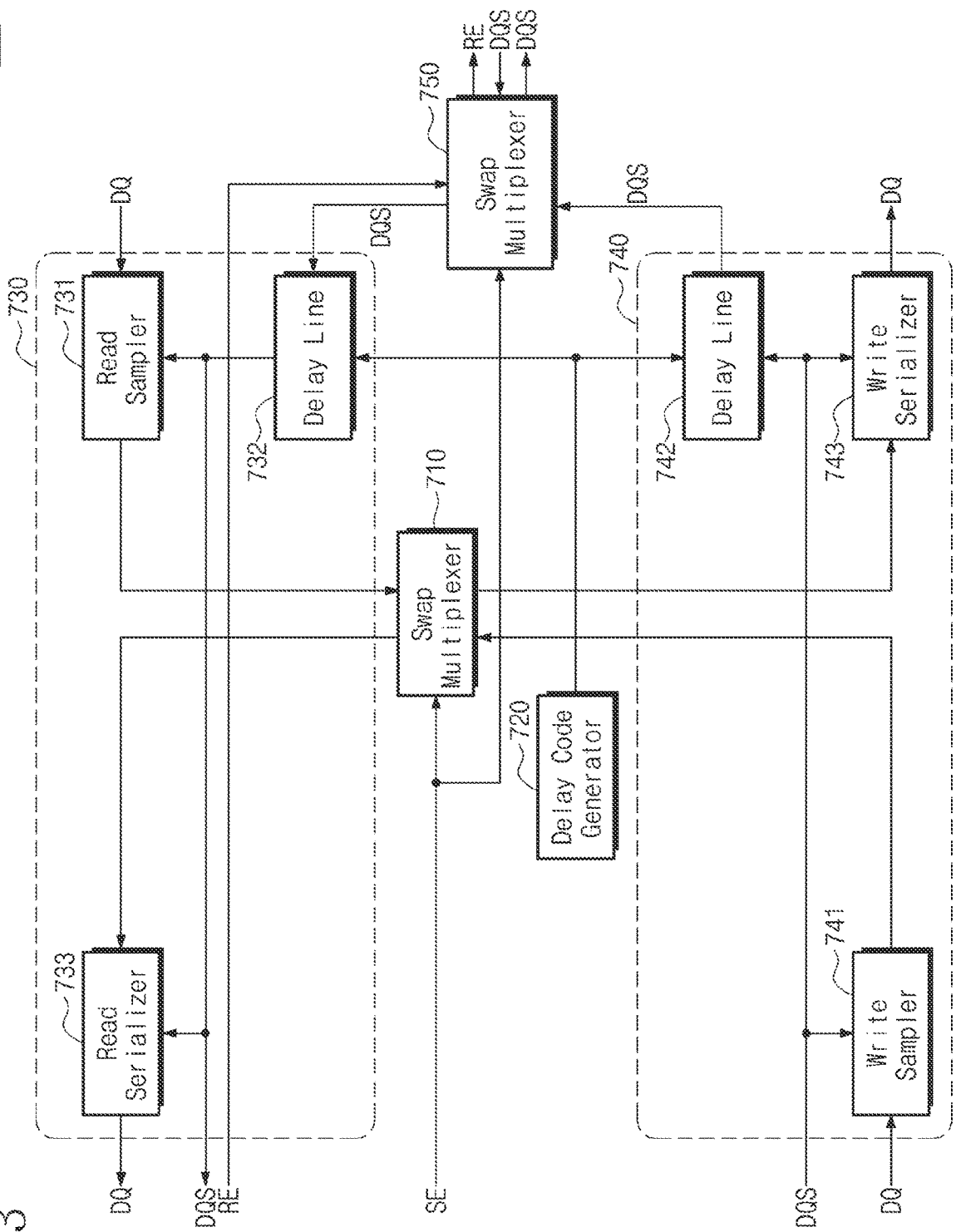

FIG. 13 is a block diagram illustrating a buffer chip 700 according to embodiments of the inventive concept. Referring to FIGS. 1, 2, 4, and 13, the buffer chip 700 may correspond to the buffer chip 150 of FIGS. 1 and 2. The buffer chip 700 may include a swap multiplexer 710, a delay code generator 720, read elements 730, write elements 740, and a timing signal swap multiplexer 750.

Compared with the buffer chip 300 of FIG. 8, the buffer chip 700 may further include the timing signal swap multiplexer 750. The timing signal swap multiplexer 750 may receive the read enable signal RE from the read elements 730. The timing signal swap multiplexer 750 may output the read enable signal RE to the first to fourth nonvolatile memory chips 110 to 140. The timing signal swap multiplexer 750 may receive the data strobe signal DQS from the write element 740. The timing signal swap multiplexer 750 may output the data strobe signal DQS to the first to fourth nonvolatile memory chips 110 to 140.

The timing signal swap multiplexer 750 may receive the data strobe signals DQS from the first to fourth nonvolatile memory chips 110 to 140. The timing signal swap multiplexer 750 may output the data strobe signals DQS to the read elements 730. The timing signal swap multiplexer 750 may selectively perform the swap of timing signals between the first to fourth nonvolatile memory chips 110 to 140 and the read elements 730 and between the first to fourth nonvolatile memory chips 110 to 140 and the write elements 740.

The read enable signal RE that is received from the read elements 730 and is swapped or is not swapped by the timing signal swap multiplexer 750 may be communicated to the first to fourth nonvolatile memory chips 110 to 140. The data strobe signal DQS that is received from the write elements 740 and is swapped or is not swapped by the timing signal swap multiplexer 750 may be communicated to the first to fourth nonvolatile memory chips 110 to 140. The data strobe signal DQS that is received from the first to fourth nonvolatile memory chips 110 to 140 and is swapped or is not swapped by the timing signal swap multiplexer 750 may be communicated to the read elements 730.

The respective structures and functions of the swap multiplexer 710, the delay code generator 720, the read elements 730 including a read sampler 731, a delay line 732, and a read serializer 733, and the write elements 740 including a write sampler 741, a delay line 742, and a write serializer 743 may be the same as those of the swap multiplexer 310, the delay code generator 320, the read elements 330 including the read sampler 331, the delay line 332, and the read serializer 333, and the write elements 340 including the write sampler 341, the delay line 342, and the write serializer 343 described in relation to FIG. 8.

In some embodiments, as described with reference to FIG. 10, the swap multiplexer 710 may be divided into two swap multiplexers so as to be disposed at the read elements 730 and the write elements 740, respectively. Also, the timing signal swap multiplexer 750 may be divided into two swap multiplexers so as to be disposed at the read elements 730 and the write elements 740, respectively.

Figure 14:
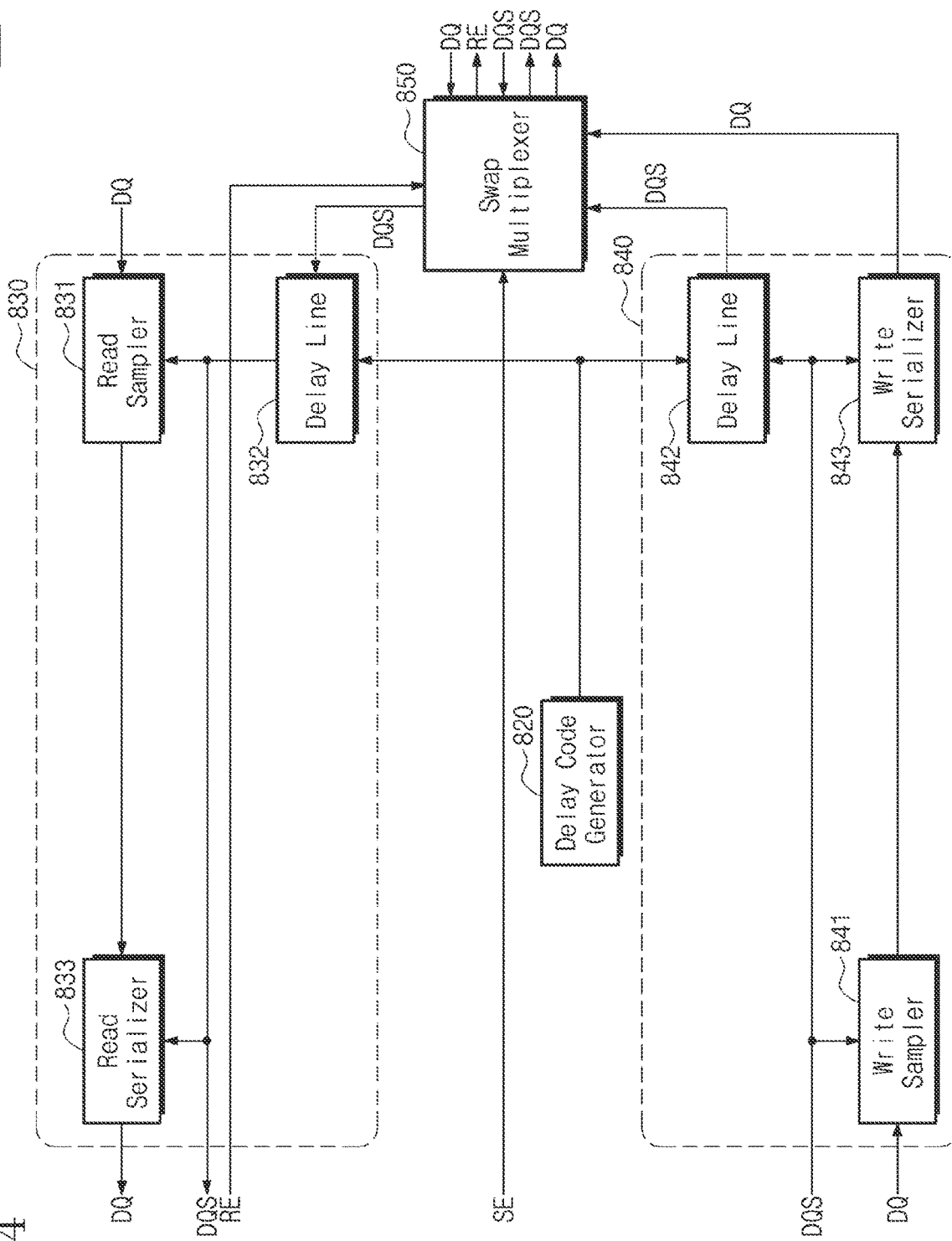

FIG. 14 is a block diagram illustrating a buffer chip 800 according to embodiments of the inventive concept. Referring to FIGS. 1, 2, 4, and 14, the buffer chip 800 may correspond to the buffer chip 150 of FIGS. 1 and 2. The buffer chip 800 may include a delay code generator 820, read elements 830, write elements 840, and an integrated swap multiplexer 850.

The integrated swap multiplexer 850 may perform or omit the swap of the data signals DQ, the data strobe signals DQS, and the read enable signal RE in response to the swap enable signal SE. The integrated swap multiplexer 850 may selectively perform the swap of timing signals between the first to fourth nonvolatile memory chips 110 to 140 and the read elements 830 and between the first to fourth nonvolatile memory chips 110 to 140 and the write elements 840.

The swap of timing signals including the data strobe signals DQS and the read enable signal RE may be performed the same as that described with reference to the timing signal swap multiplexer 550 of FIG. 13. The swap of the data signals DQ may be performed between the read elements 830 and the controller package 230 or between the write elements 840 and the controller package 230 to be the same as that described with reference to FIG. 8.

The respective structures and functions of the delay code generator 820, the read elements 830 including a read sampler 831, a delay line 832, and a read serializer 833, and the write elements 840 including a write sampler 841, a delay line 842, and a write serializer 843 may be the same as those of the delay code generator 320, the read elements 330 including the read sampler 331, the delay line 332, and the read serializer 333, and the write elements 340 including the write sampler 341, the delay line 342, and the write serializer 343 described in relation to FIG. 8.

In some embodiments, as described with reference to FIG. 10, the integrated swap multiplexer 850 may be divided into two swap multiplexers so as to be disposed at the read elements 830 and the write elements 840, respectively.

Figure 15:
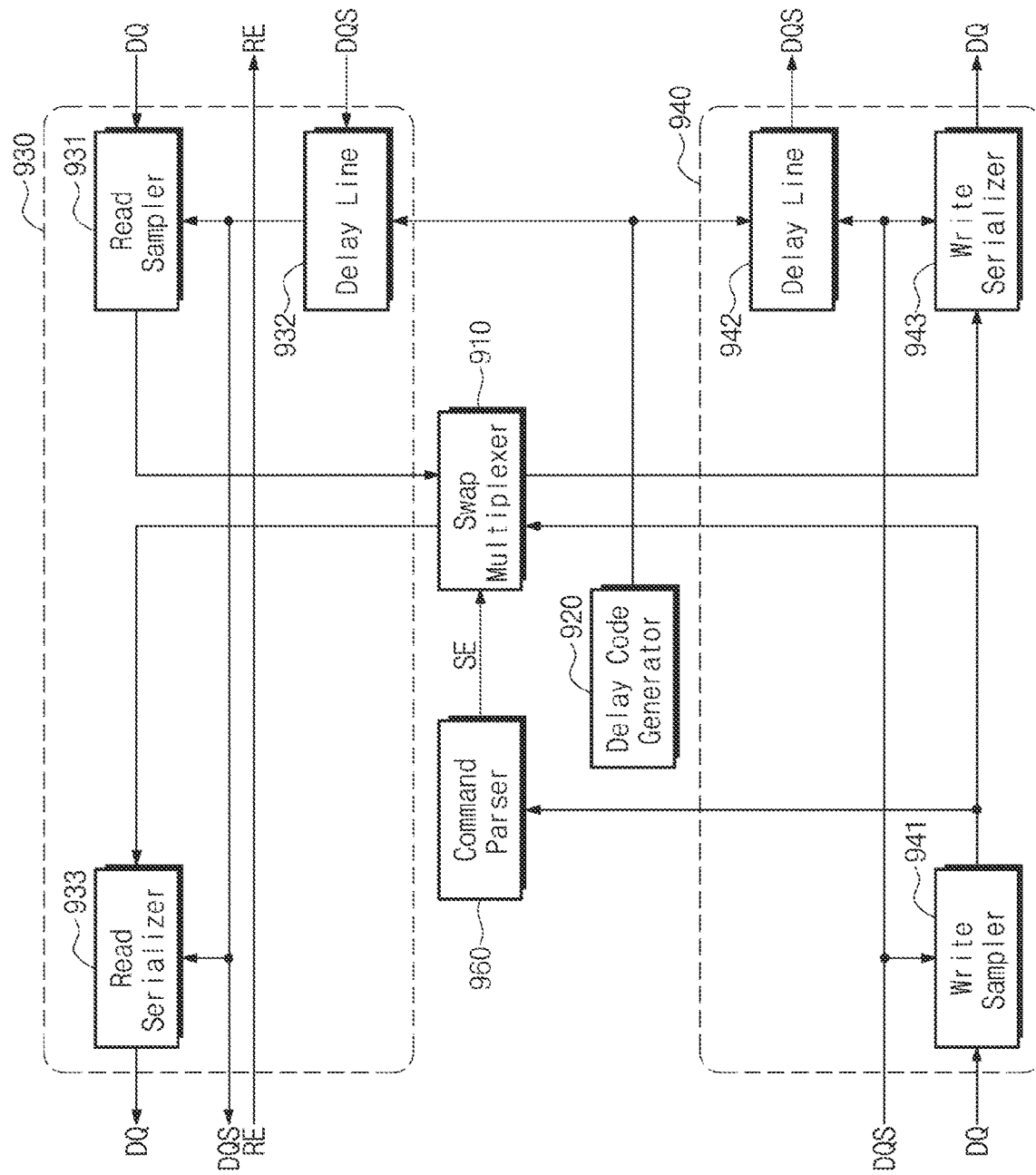

FIG. 15 is a block diagram illustrating a buffer chip 900 according to embodiments of the inventive concept. Referring to FIGS. 1, 2, 4, and 15, the buffer chip 900 may correspond to the buffer chip 150 of FIGS. 1 and 2. The buffer chip 900 may include a swap multiplexer 910, a delay code generator 920, read elements 930, write elements 940, and a command parser 960.

The command parser 960 may receive data signals sampled by a write sampler 941 of the write elements 940. The command parser 960 may parse the received data signals and may enable or disable the swap enable signal SE depending on the parsed result.

For example, when a power is supplied to the storage device 200, the controller package 230 may be configured to communicate a specified command to the first memory package 210 and the second memory package 220. For example, the specified command may include an initialization command, a status read command, a get features command, or the like, and may be defined by the standard or vendor specific.

The command parser 960 may store a pattern (e.g., a pattern of bits) of the specified command. The command parser 960 may compare data signals, which are first sampled by the write sampler 941 after the power-on, with the pattern of the specified command. When a pattern of the sampled data signals coincides with the pattern of the specified command, the command parser 960 may disable the swap enable signal SE. When the pattern of the sampled data signals does not coincide with the pattern of the specified command, the command parser 960 may enable the swap enable signal SE.

Also, when the swap enable signal SE is enabled, the command parser 960 may control the swap multiplexer 910 such that the data signals compared by the command parser 960 are swapped and output by the swap multiplexer 910.

The respective structures and functions of the swap multiplexer 910, the delay code generator 920, the read elements 930 including a read sampler 931, a delay line 932, and a read serializer 933, and the write elements 940 including the write sampler 941, a delay line 942, and a write serializer 943 may be the same as those of the swap multiplexer 310, the delay code generator 320, the read elements 330 including the read sampler 331, the delay line 332, and the read serializer 333, and the write elements 340 including the write sampler 341, the delay line 342, and the write serializer 343 described in relation to FIG. 8.

In some embodiments, as described with reference to FIG. 10, the swap multiplexer 910 may be divided into two swap multiplexers so as to be disposed at the read elements 930 and the write elements 940, respectively. Also, as described with reference to FIGS. 11 and 13, the buffer chip 900 may further include a timing signal swap multiplexer for swapping timing signals. Also, as described with reference to FIGS. 12 and 14, an integrated swap multiplexer for swapping timing signals and the data signals DQ may be provided instead of the swap multiplexer 910.

Figure 16:
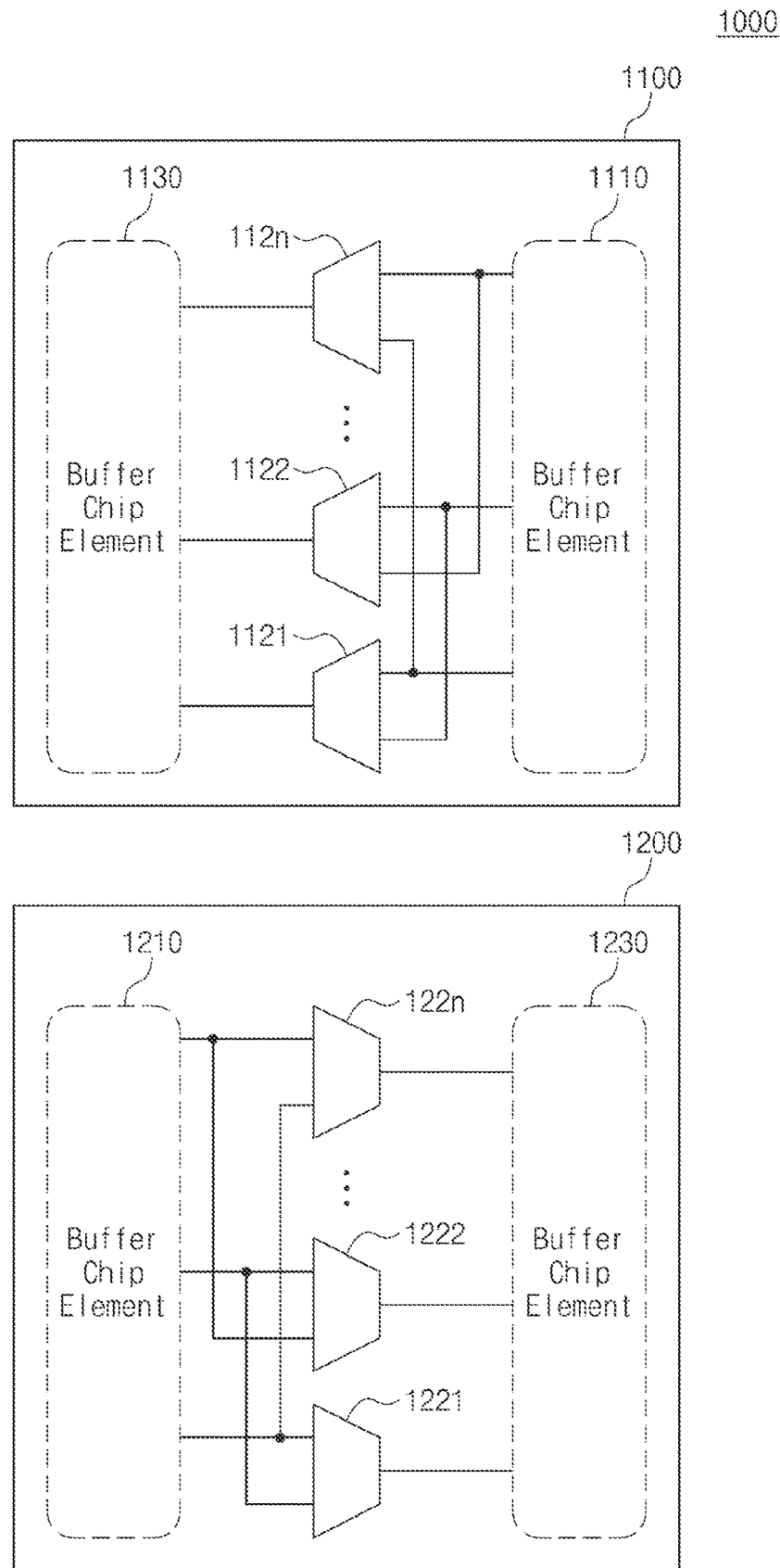
FIG. 16 is a block diagram illustrating a multiplexer according to embodiments of the inventive concept.

FIG. 16 is a block diagram illustrating a multiplexer 1000 according to embodiments of the inventive concept. Referring to FIGS. 1, 2, 4, and 16, the multiplexer 1000 may be implemented with the swap multiplexer 310 of FIG. 8, the swap multiplexer 510 or the timing signal swap multiplexer 550 of FIG. 11, the integrated swap multiplexer 650 of FIG. 11, the swap multiplexer 710 or the timing signal swap multiplexer 750 of FIG. 13, the integrated swap multiplexer 850 of FIG. 14, or the swap multiplexer 910 of FIG. 15.

The multiplexer 1000 may include first elements 1100 and second elements 1200. The first elements 1100 may be implemented with the first swap multiplexer 434 of FIG. 10, and the second elements 1200 may be implemented with the second swap multiplexer 444 of FIG. 10. The first elements 1100 may be applied to timing signals or the data signals DQ that are communicated from the first to fourth nonvolatile memory chips 110 to 140 to the controller package 230. The second elements 1200 may be applied to timing signals or the data signals DQ that are communicated from the controller package 230 to the first to fourth nonvolatile memory chips 110 to 140.

The first elements 1100 may include first buffer chip elements 1110, second buffer chip elements 1130, and first multiplexers 1121 to 112n (n being a positive integer more than 1). Each of the first multiplexers 1121 to 112n may select one of signals communicated from the first buffer chip elements 1110 so as to be communicated to the second buffer chip elements 1130.

In some embodiments, one signal output from the first buffer chip elements 1110 may be communicated to two first multiplexers. For example, an output signal (e.g., a first signal) associated with the first high-speed signal solder ball HS1 of the first buffer chip elements 1110 may be output to a first multiplexer associated with the first high-speed signal solder ball HS1 of the second buffer chip elements 1130 and a first multiplexer associated with the fourth high-speed signal solder ball HS4 of the second buffer chip elements 1130. The two first multiplexers receiving the first signal may be output to either portions associated with the first high-speed signal solder ball HS1 of the second buffer chip elements 1130 or portions associated with the fourth high-speed signal solder ball HS4 of the second buffer chip elements 1130.

The second elements 1200 may include third buffer chip elements 1210, fourth buffer chip elements 1230, and second multiplexers 1221 to 122n (n being a positive integer more than 1). Each of the second multiplexers 1221 to 122n may select one of signals communicated from the third buffer chip elements 1210 so as to be communicated to the fourth buffer chip elements 1230.

In some embodiments, one signal output from the third buffer chip elements 1210 may be communicated to two second multiplexers. For example, an output signal (e.g., a second signal) associated with the second high-speed signal solder ball HS2 of the third buffer chip elements 1210 may be output to a second multiplexer associated with the second high-speed signal solder ball HS2 of the fourth buffer chip elements 1230 and a second multiplexer associated with the fifth high-speed signal solder ball HS5 of the fourth buffer chip elements 1230. The two second multiplexers receiving the second signal may be output to either portions associated with the second high-speed signal solder ball HS2 of the fourth buffer chip elements 1230 or portions associated with the fifth high-speed signal solder ball HS5 of the fourth buffer chip elements 1230.

Figure 17:
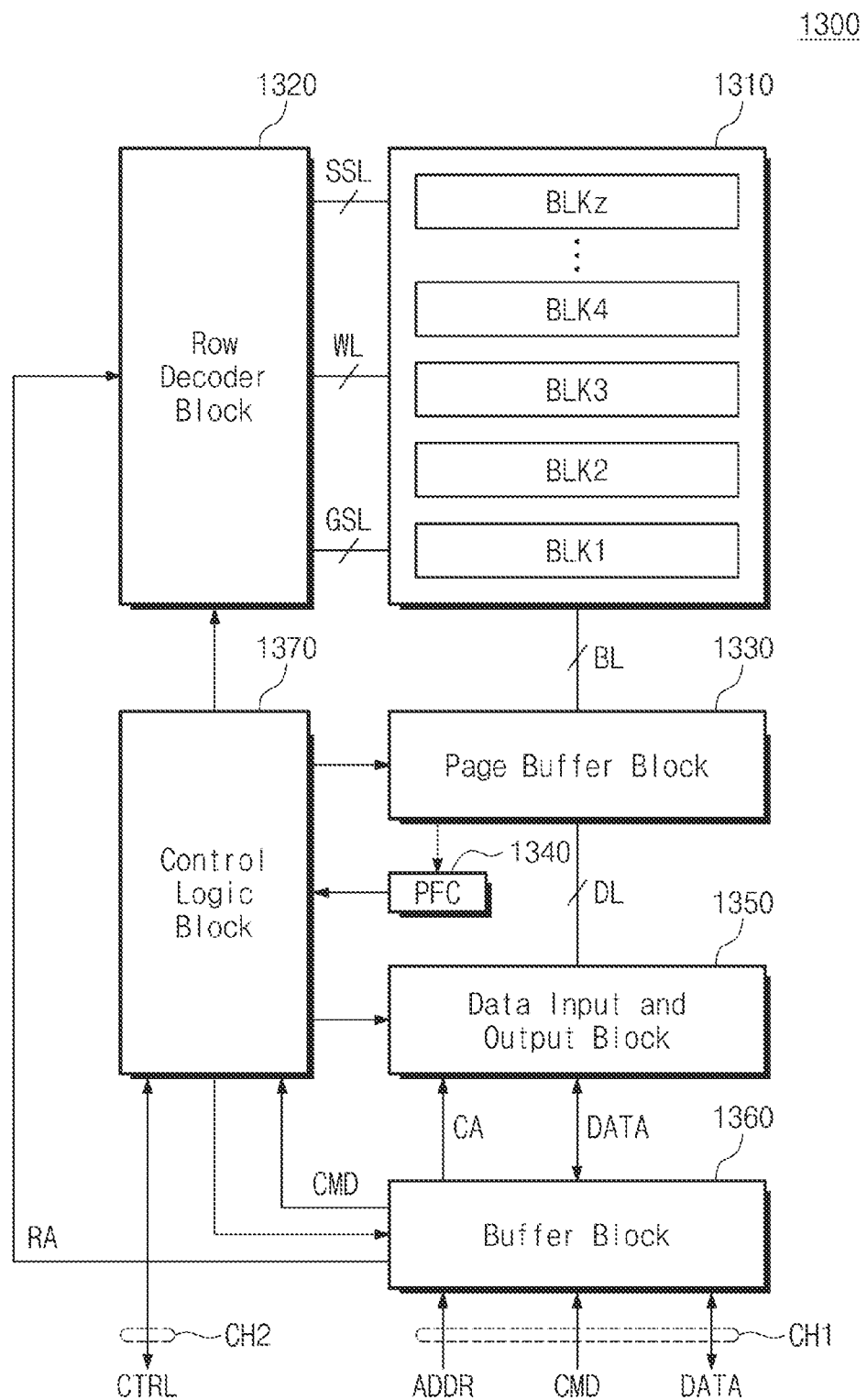
FIG. 17 is a block diagram illustrating a nonvolatile memory chip according to embodiments of the inventive concept.

FIG. 17 is a block diagram illustrating a nonvolatile memory chip 1300 according to embodiments of the inventive concept. Referring to FIG. 17, the nonvolatile memory chip 1300 includes a memory cell array 1310, a row decoder block 1320, a page buffer block 1330, a pass/fail check block (PFC) 1340, a data input and output block 1350, a buffer block 1360, and a control logic block 1370.

The memory cell array 1310 includes a plurality of memory blocks BLK1 to BLKz. Each of the memory blocks BLK1 to BLKz includes a plurality of memory cells. Each of the memory blocks BLK1 to BLKz may be connected with the row decoder block 1320 through ground selection lines GSL, word lines WL, and string selection lines SSL. Some of the word lines WL may be used as dummy word lines. Each of the memory blocks BLK1 to BLKz may be connected with the page buffer block 1330 through a plurality of bit lines BL. The plurality of memory blocks BLK1 to BLKz may be connected in common with the plurality of bit lines BL.

In some embodiments, each of the plurality of memory blocks BLK1 to BLKz may be a unit of an erase operation. The memory cells belonging to each of the memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of an erase operation.

The row decoder block 1320 is connected with the memory cell array 1310 through the ground selection lines GSL, the word lines WL, and the string selection lines SSL. The row decoder block 1320 operates under control of the control logic block 1370.

The row decoder block 1320 may decode a row address RA received from the buffer block 1360 and may control voltages to be applied to the string selection lines SSL, the word lines WL, and the ground selection lines GSL based on the decoded row address.

The page buffer block 1330 is connected with the memory cell array 1310 through the plurality of bit lines BL. The page buffer block 1330 is connected with the data input and output block 1350 through a plurality of data lines DL. The page buffer block 1330 operates under control of the control logic block 1370.

In a program operation, the page buffer block 1330 may store data to be written in memory cells. The page buffer block 1330 may apply voltages to the plurality of bit lines BL based on the stored data. In a read operation or in a verify read operation that is performed in the program operation or an erase operation, the page buffer block 1330 may sense voltages of the bit lines BL and may store the sensing result.

In the verify read operation associated with the program operation or the erase operation, the pass/fail check block 1340 may verify the sensing result of the page buffer block 1330. For example, in the verify read operation associated with the program operation, the pass/fail check block 1340 may count the number of values (e.g., the number of 0s) respectively corresponding to on-cells that are not programmed to a target threshold voltage or more.

In the verify read operation associated with the erase operation, the pass/fail check block 1340 may count the number of values (e.g., the number of 1s) respectively corresponding to off-cells that are not erased to a target threshold voltage or less. When the counted result is a threshold value or more, the pass/fail check block 1340 may output a fail signal to the control logic block 1370. When the counted result is smaller than the threshold value, the pass/fail check block 1340 may output a pass signal to the control logic block 1370. Depending on a result of the verification of the pass/fail check block 1340, a program loop of the program operation may be further performed, or an erase loop of the erase operation may be further performed.

The data input and output block 1350 is connected with the page buffer block 1330 through the plurality of data lines DL. The data input and output block 1350 may receive a column address CA from the buffer block 1360. The data input and output block 1350 may output data read by the page buffer block 1330 to the buffer block 1360 depending on the column address CA. The data input and output block 1350 may provide data received from the buffer block 1360 to the page buffer block 1330, based on the column address CA.

The buffer block 1360 may receive a command CMD and an address ADDR from an external device through a first channel CH1 and may exchange data "DATA" with the external device. The buffer block 1360 may operate under control of the control logic block 1370. The buffer block 1360 may provide the command CMD to the control logic block 1370. The buffer block 1360 may provide the row address RA of the address ADDR to the row decoder block 1320 and may provide the column address CA of the address ADDR to the data input and output block 1350. The buffer block 1360 may exchange the data "DATA" with the data input and output block 1350.

In some embodiments, the first channel CH1 may correspond to the data signals DQ. The command CMD and the address ADDR may be synchronized with the data strobe signals DQS in the SDR manner, and the data "DATA" may be synchronized with the data strobe signals DQS in the SDR or DDR manner. The control logic block 1370 may exchange control signals CTRL with the external device through a second channel CH2. The control logic block 1370 may allow the buffer block 1360 to route the command CMD, the address ADDR, and the data "DATA". The control logic block 1370 may decode the command CMD received from the buffer block 1360 and may control the nonvolatile memory chip 1300 based on the decoded command.

In some embodiments, the second channel CH2 may correspond to high-speed signals including the data strobe signals DQS and the read enable signal RE and low-speed signals including the power, the write protect signal WP, the command latch enable signal CLE, the address latch enable signal ALE, the chip enable signal CE, the ready and busy signal RnB, or the write enable signal WE.

In some embodiments, the nonvolatile memory chip 1300 may be manufactured in a bonding manner. The memory cell array 1310 may be manufactured at a first wafer, and the row decoder block 1320, the page buffer block 1330, the pass/fail check block 1340, the data input and output block 1350, the buffer block 1360, and the control logic block 1370 may be manufactured at a second wafer. The nonvolatile memory chip 1300 may be implemented by coupling the first wafer and the second wafer such that an upper surface of the first wafer and an upper surface of the second wafer face each other.

For another example, the nonvolatile memory chip 1300 may be manufactured in a cell over peri (COP) manner. The peripheral circuit including the row decoder block 1320, the page buffer block 1330, the pass/fail check block 1340, the data input and output block 1350, the buffer block 1360, and the control logic block 1370 may be implemented on a substrate. The memory cell array 1310 may be implemented on the upper of the peripheral circuit. The peripheral circuit and the memory cell array 1310 may be connected by using through vias.

In the above embodiments, components according to the inventive concept are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments of the inventive concept are described by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept, a buffer chip of a memory package may support signal multiplexing corresponding to package mirroring. Accordingly, a memory package supporting the package mirroring without changing a legacy structure of a nonvolatile memory chip, a storage device including the memory package, and an operating method of the storage device are provided.

While the inventive concept has been described with reference to certain embodiments thereof, but it will be apparent to those skilled in the art that various changes and modifications may be made to the illustrated and described embodiments without departing from the spirit and scope of the inventive concept as set forth in the following claims.

What is claimed is:

1. A buffer chip comprising:
a plurality of first buffer pads configured to be connected with an external memory; and
a plurality of second buffer pads configured to be connected with an external memory controller,
wherein, during a read operation, in response to a swap enable signal being a first signal, the buffer chip is configured to transfer signals of the plurality of first buffer pads to the plurality of second buffer pads,
wherein, during the read operation, in response to the swap enable signal being a second signal, the buffer chip is configured to swap at least a portion of the signals of the plurality of first buffer pads and transfer the swapped signals of the plurality of first buffer pads to the plurality of second buffer pads,
wherein, during a write operation, in response to the swap enable signal being a third signal, the buffer chip is configured to transfer signals of the plurality of second buffer pads to the plurality of first buffer pads,
wherein, during the write operation, in response to the swap enable signal being a fourth signal, the buffer chip is configured to swap at least a portion of the signals of the plurality of second buffer pads and transfer the swapped signals of the plurality of second buffer pads to the plurality of first buffer pads, and
wherein the swapped signals of the plurality of first buffer pads and the plurality of second buffer pads include a swapped data signal.

2. The buffer chip of claim 1, wherein the plurality of second buffer pads include a swap enable pad designated to receive the swap enable signal from the external memory controller.

3. The buffer chip of claim 1, wherein the buffer chip is configured to receive a command signal from the external memory controller via at least one of the plurality of second buffer pads, and
wherein the buffer chip is configured to generate the swap enable signal based on the command signal.

4. The buffer chip of claim 1, wherein signal speed of at least one of the swapped signals of the plurality of first buffer pads and the plurality of second buffer pads are greater than signal speed of at least one non-swapped signal of the signals of the plurality of first buffer pads and the plurality of second buffer pads.

5. An operating method of a buffer chip comprising a plurality of first buffer pads configured to be connected with an external memory and a plurality of second buffer pads configured to be connected with an external memory controller, the operating method comprising:
- in response to a swap enable signal being a first signal, during a read operation by the buffer chip, transferring signals the plurality of first buffer pads to the plurality of second buffer pads;
- in response to the swap enable signal being a second signal, during the read operation by the buffer chip, swapping at least a portion of the signals of the plurality of first buffer pads and transferring the swapped signals of the plurality of first buffer pads to the plurality of second buffer pads;
- in response to the swap enable signal being a third signal, during a write operation by the buffer chip, transferring signals of the plurality of second buffer pads to the plurality of first buffer pads; and
- in response to the swap enable signal being a fourth signal, during the write operation by the buffer chip, swapping at least a portion of the signals of the plurality of second buffer pads and transferring the swapped signals of the plurality of second buffer pads to the plurality of first buffer pads,
- wherein the swapped signals of the plurality of first buffer pads and the plurality of second buffer pads include a swapped data signal.

6. The operating method of claim 5, further comprising:
receiving the swap enable signal via a swap enable pad among the plurality of second buffer pads, the swap enable pad being designated to receive the swap enable signal.

7. The operating method of claim 5, further comprising:
receiving a command signal from at least one of the plurality of second buffer pads; and
generating the swap enable signal based on the command signal.

8. The operating method of claim 5, wherein signal speed of at least one of the swapped signals of the plurality of first buffer pads and the plurality of second buffer pads are greater than signal speed of at least one non-swapped signal of the signals of the plurality of first buffer pads and the plurality of second buffer pads.

9. A memory package comprising:
a memory chip including a plurality of memory pads; and
a buffer chip including a plurality of first buffer pads connected with the plurality of memory pads and a plurality of second buffer pads configured to be connected with an external memory controller,
wherein, during a read operation, in response to a swap enable signal being a first signal, the buffer chip is configured to transfer signals of the plurality of first buffer pads to the plurality of second buffer pads,
wherein, during the read operation, in response to the swap enable signal being a second signal, the buffer chip is configured to swap at least a portion of the signals of the plurality of first buffer pads and transfer the swapped signals of the plurality of first buffer pads to the plurality of second buffer pads,
wherein, during a write operation, in response to the swap enable signal being a third signal, the buffer chip is configured to transfer signals of the plurality of second buffer pads to the plurality of first buffer pads,
wherein, during the write operation, in response to the swap enable signal being a fourth signal, the buffer chip is configured to swap at least a portion of the signals of the plurality of second buffer pads and transfer the swapped signals of the plurality of second buffer pads to the plurality of first buffer pads, and
wherein the swapped signals of the plurality of first buffer pads and the plurality of second buffer pads include a swapped data signal.

10. The memory package of claim 9, wherein the plurality of second buffer pads include a swap enable pad designated to receive the swap enable signal from the external memory controller.

11. The memory package of claim 9, wherein the buffer chip is configured to receive a command signal from the external memory controller via at least one of the plurality of second buffer pads, and
wherein the buffer chip is configured to generate the swap enable signal based on the command signal.

12. The memory package of claim 9, wherein signal speed of at least one of the swapped signals of the plurality of first buffer pads and the plurality of second buffer pads are greater than signal speed of at least one non-swapped signal of the signals of the plurality of first buffer pads and the plurality of second buffer pads.

13. An operating method of a memory package comprising a memory chip and a buffer chip, the memory chip including a plurality of memory pads, the buffer chip including a plurality of first buffer pads connected with the plurality of memory pads and a plurality of second buffer pads configured to be connected with an external memory controller, the operating method comprising:
- in response to a swap enable signal being a first signal, during a read operation by the buffer chip, transferring signals of the plurality of first buffer pads to the plurality of second buffer pads;
- in response to the swap enable signal being a second signal, during the read operation by the buffer chip, swapping at least a portion of the signals of the plurality of first buffer pads and transferring the swapped signals of the plurality of first buffer pads to the plurality of second buffer pads;
- in response to the swap enable signal being a third signal, during a write operation by the buffer chip, transferring signals of the plurality of second buffer pads to the plurality of first buffer pads; and
- in response to the swap enable signal being a fourth signal, during the write operation by the buffer chip, swapping at least a portion of the signals of the plurality of second buffer pads and transferring the swapped signals of the plurality of second buffer pads to the plurality of first buffer pads,
- wherein the swapped signals of the plurality of first buffer pads and the plurality of second buffer pads include a swapped data signal.

14. The operating method of claim 13, further comprising:
receiving the swap enable signal via a swap enable pad among the plurality of second buffer pads, the swap enable pad being designated to receive the swap enable signal.

15. The operating method of claim 13, further comprising:
receiving a command signal from at least one of the plurality of second buffer pads; and
generating the swap enable signal based on the command signal.

16. The operating method of claim 13, wherein signal speed of at least one of the swapped signals of the plurality of first buffer pads and the plurality of second buffer pads are greater than signal speed of at least one non-swapped signal of the signals of the plurality of first buffer pads and the plurality of second buffer pads.

* * * * *